(12) United States Patent
Kim et al.

(10) Patent No.: US 11,974,489 B2
(45) Date of Patent: Apr. 30, 2024

(54) ORGANIC LIGHT EMITTING DISPLAY APPARATUS

(71) Applicant: LG Display Co., Ltd., Seoul (KR)

(72) Inventors: Hyoung-Su Kim, Paju-si (KR); Jonghyeok Im, Paju-si (KR); Gyungmin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/058,192

(22) Filed: Nov. 22, 2022

(65) Prior Publication Data

US 2023/0078147 A1 Mar. 16, 2023

Related U.S. Application Data

(63) Continuation of application No. 17/119,647, filed on Dec. 11, 2020, now Pat. No. 11,538,874.

(30) Foreign Application Priority Data

Dec. 24, 2019 (KR) .......................... 10-2019-0173672

(51) Int. Cl.
*G09G 3/3266* (2016.01)
*G09G 3/3233* (2016.01)
(Continued)

(52) U.S. Cl.
CPC ........... *H10K 59/65* (2023.02); *G09G 3/3233* (2013.01); *G09G 3/3266* (2013.01);
(Continued)

(58) Field of Classification Search
CPC .... H10K 59/60; G09G 3/3233; G09G 3/3266; G09G 3/3275
See application file for complete search history.

(56) References Cited

U.S. PATENT DOCUMENTS 9,767,728 B2 9/2017 Evans, V et al.
10,186,191 B2 1/2019 Kang et al.
(Continued)

FOREIGN PATENT DOCUMENTS

CN 108154846 A 6/2018
CN 108269536 A 7/2018
(Continued)

*Primary Examiner* — Kevin M Nguyen
(74) *Attorney, Agent, or Firm* — Seed IP Law Group LLP

(57) ABSTRACT

An organic light emitting display apparatus includes an organic light emitting display panel including a display area having a transparent area and an opaque area, and a non-display area. A gate driver is configured to sequentially supply a gate pulse to a plurality of gate lines included in the organic light emitting display panel. An initialization circuit is configured to transfer gate pulses or initialization control signals, output from the gate driver, to a plurality of transparent area gate lines. A camera is configured to photograph a region in a forward direction with respect to the organic light emitting display panel, and the camera may be provided in the transparent area of a rear surface of the organic light emitting display panel. A first pixel driving circuit provided in the transparent area may differ from a second pixel driving circuit provided in the opaque area.

23 Claims, 19 Drawing Sheets

(51) Int. Cl.
*G09G 3/3275* (2016.01)
*H04N 23/57* (2023.01)
*H10K 59/121* (2023.01)
*H10K 59/65* (2023.01)
*H04M 1/02* (2006.01)

(52) U.S. Cl.
CPC .......... *G09G 3/3275* (2013.01); *H04N 23/57* (2023.01); *H10K 59/1216* (2023.02); *G09G 2300/0809* (2013.01); *G09G 2300/0819* (2013.01); *G09G 2300/0842* (2013.01); *G09G 2300/0861* (2013.01); *G09G 2310/0221* (2013.01); *G09G 2310/08* (2013.01); *H04M 1/0264* (2013.01); *H04M 1/0266* (2013.01)

(56) References Cited

U.S. PATENT DOCUMENTS

| | | |
|---|---|---|
| 10,235,942 B2 | 3/2019 | Choi |
| 10,854,690 B2 * | 12/2020 | Bae .................. H10K 59/60 |
| 11,074,856 B2 * | 7/2021 | Zhao .................. G09G 3/3266 |
| 11,348,522 B2 | 5/2022 | Kim et al. |
| 2015/0049165 A1 | 2/2015 | Choi |
| 2015/0116191 A1 * | 4/2015 | Qi .................. G09G 3/3233 |
| | | 345/76 |
| 2017/0178566 A1 | 6/2017 | Xu et al. |
| 2019/0037063 A1 | 1/2019 | Zeng |
| 2020/0020737 A1 | 1/2020 | Jin |
| 2020/0098313 A1 * | 3/2020 | Bian .................. G09G 3/3266 |
| 2020/0258452 A1 | 8/2020 | Feng et al. |
| 2020/0258953 A1 * | 8/2020 | Bae .................. H10K 59/65 |

FOREIGN PATENT DOCUMENTS

| | | |
|---|---|---|
| CN | 108682392 A | 10/2018 |
| KR | 20100093099 A | 8/2010 |
| KR | 20190006689 A | 1/2019 |

* cited by examiner

| Gray | ΔVTH −0.5V | ΔVTH 0V | ΔVTH +0.5V | Luminance difference |
|---|---|---|---|---|
| 255gray | 21.444 nA | 21.162 nA | 21.132 nA | 1.5% |
| 64gray | 1.022 nA | 1.001 nA | 1.000 nA | 2.1% |
| 31gray | 0.183 nA | 0.156 nA | 0.189 nA | 18.6% |

(a)

| Gray | ΔVTH −0.5V | ΔVTH 0V | ΔVTH +0.5V | Luminance difference |
|---|---|---|---|---|
| 255gray | 22.285 nA | 21.681 nA | 21.314 nA | 4.5% |
| 64gray | 1.064 nA | 1.034 nA | 0.977 nA | 8.5% |
| 31gray | 0.226 nA | 0.219 nA | 0.186 nA | 19.0% |

(b)

ORGANIC LIGHT EMITTING DISPLAY APPARATUS

CROSS-REFERENCE TO RELATED APPLICATIONS

This application is a continuation of U.S. patent application Ser. No. 17/119,647, filed Dec. 11, 2020, which claims the benefit of Korean Patent Application No. 10-2019-0173672 filed on Dec. 24, 2019, which are herein incorporated by reference in their entirety.

BACKGROUND

Technical Field

The present disclosure relates to an organic light emitting display apparatus where a camera is mounted in a forward direction with respect to an organic light emitting display panel.

Description of the Related Art

As various kinds of applications are provided in electronic devices such as smartphones, users desire display apparatuses including a wider display unit.

Moreover, in electronic devices such as smartphones, a camera is mounted in a forward direction with respect to a display panel so that a user photographs its own form while looking at its own form.

In this case, in order to maximally enlarge a width of a display area displaying an image in a display apparatus, a camera may be provided in the display area.

However, in order to prevent a luminance deviation caused by the degradation in each driving transistor, four or more transistors are included in each pixel of an organic light emitting display panel which is a type of display panel. Therefore, even when a portion, corresponding to a camera, of the organic light emitting display panel is implemented as a transparent panel, a transmittance of light is reduced by transistors included in the transparent panel.

Due to this, the amount of light transferred to a camera is reduced, causing the degradation in quality of an image captured by the camera.

BRIEF SUMMARY

Accordingly, the present disclosure is directed to providing an organic light emitting display apparatus that substantially obviates one or more problems due to limitations and disadvantages of the related art.

An aspect of the present disclosure is directed to providing an organic light emitting display apparatus in which a first pixel driving circuit provided in a transparent area, corresponding to a position of a camera, of a display area has a shape differing from that of a second pixel driving circuit provided in an opaque area, except the transparent area, of the display area.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display apparatus including an organic light emitting display panel including a display area, including a transparent area and an opaque area, and a non-display area, a gate driver sequentially supplying a gate pulse to a plurality of gate lines included in the organic light emitting display panel, and an initialization unit transferring gate pulses and/or initialization control signals, output from the gate driver, to a plurality of transparent area gate lines. A camera photographing a region in a forward direction with respect to the organic light emitting display panel may be provided in the transparent area of a rear surface of the organic light emitting display panel, and a first pixel driving circuit provided in the transparent area may differ from a second pixel driving circuit provided in the opaque area.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
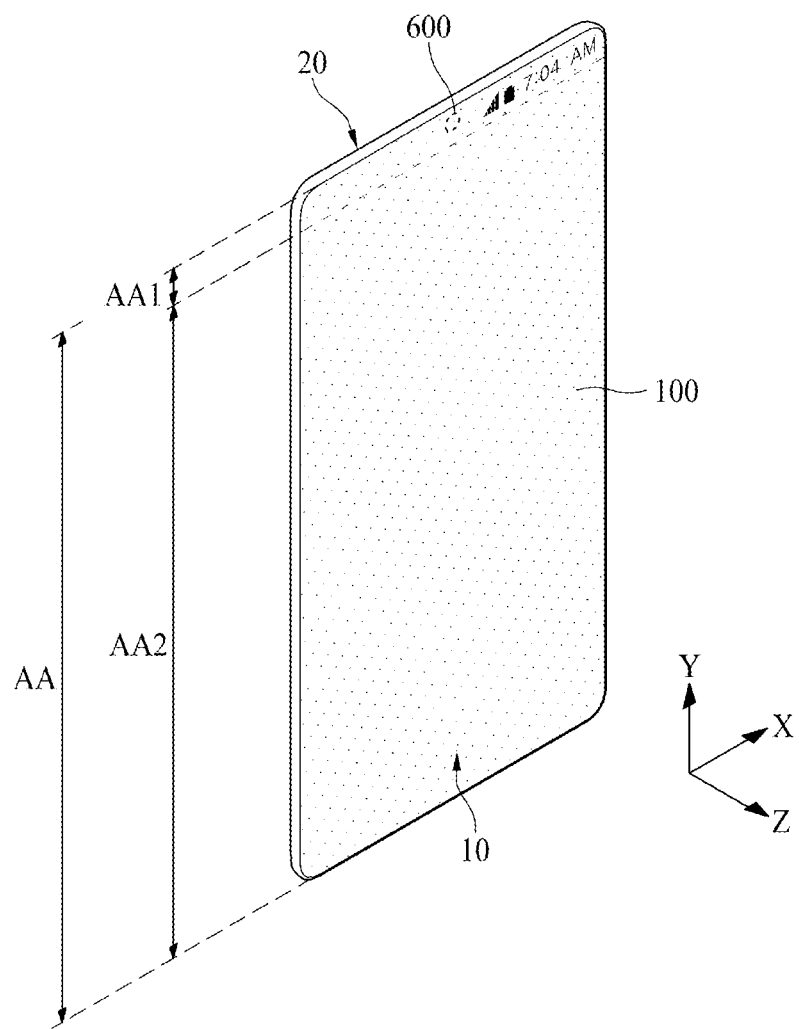
FIG. 1 is an exemplary diagram illustrating an external configuration of an electronic device to which an organic light emitting display apparatus according to an embodiment of the present disclosure is applied.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is an exemplary diagram illustrating an external configuration of an electronic device to which an organic light emitting display apparatus according to an embodiment of the present disclosure is applied.

The organic light emitting display apparatus according to an embodiment of the present disclosure may configure an electronic device. The electronic device may include, for example, a smartphone, a tablet personal computer (PC), a television (TV), a monitor, etc. In FIG. 1, a smartphone is illustrated as an example of the electronic device. In the following description, an example where the electronic device is a smartphone will be described.

Figure 2:
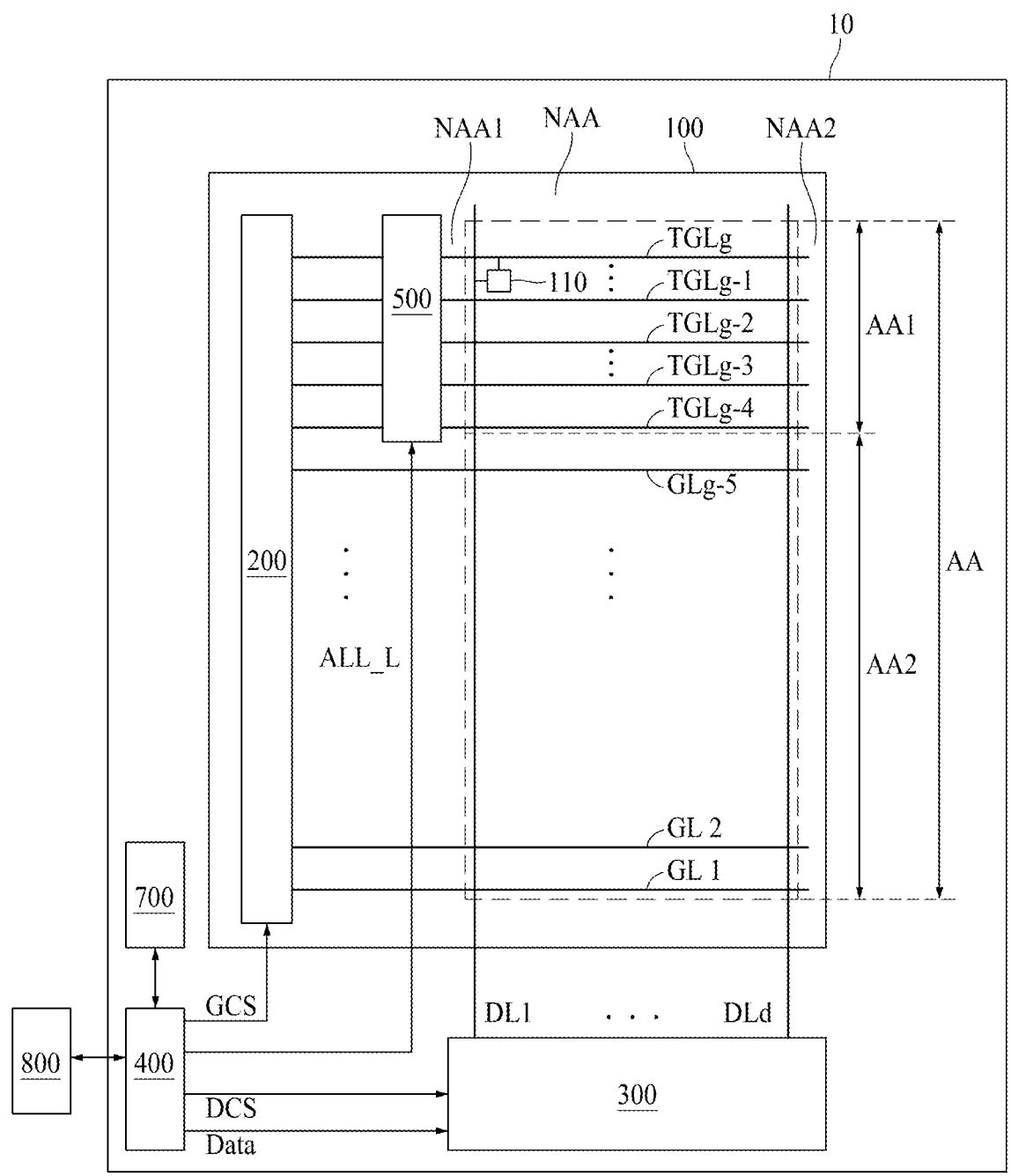
FIG. 2 is an exemplary diagram illustrating an internal configuration of an organic light emitting display apparatus according to an embodiment of the present disclosure.
Figure 3:
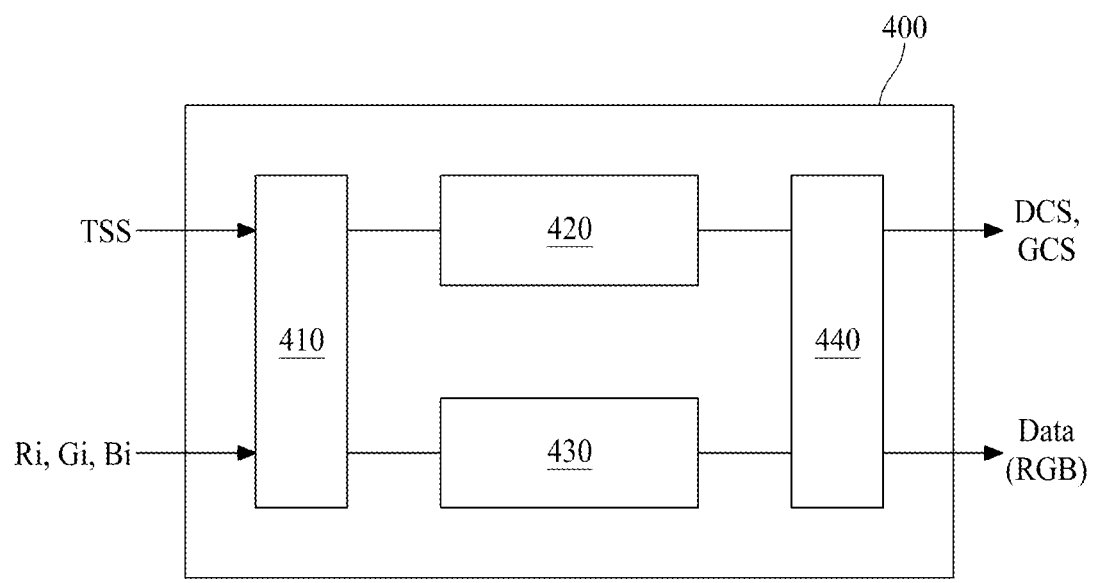
FIG. 3 is an exemplary diagram illustrating a configuration of a controller applied to an organic light emitting display apparatus according to an embodiment of the present disclosure.
Figure 4:
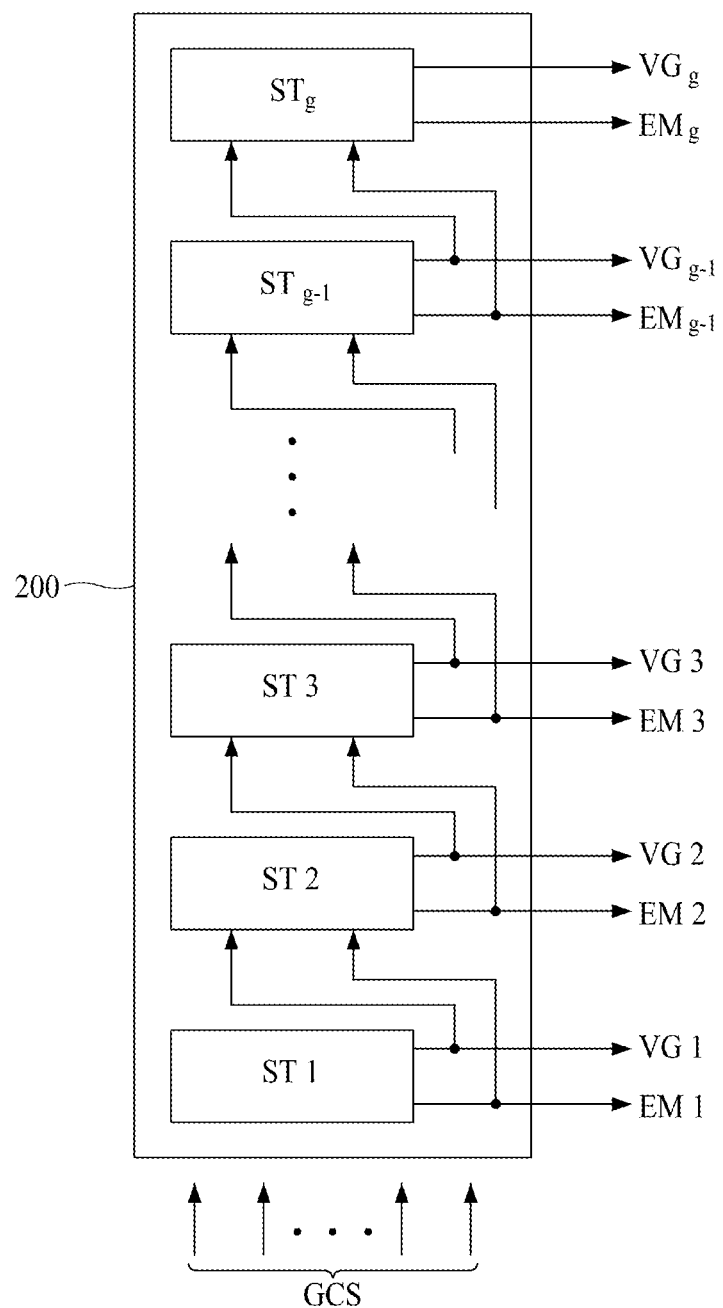
FIG. 4 is an exemplary diagram illustrating a configuration of a gate driver applied to an organic light emitting display apparatus according to an embodiment of the present disclosure.

FIG. 2 is an exemplary diagram illustrating an internal configuration of an organic light emitting display apparatus according to an embodiment of the present disclosure, FIG. 3 is an exemplary diagram illustrating a configuration of a controller applied to an organic light emitting display apparatus according to an embodiment of the present disclosure, and FIG. 4 is an exemplary diagram illustrating a configuration of a gate driver applied to an organic light emitting display apparatus according to an embodiment of the present disclosure.

The electronic device, as illustrated in FIGS. 1 and 2, may include an organic light emitting display apparatus 10 according to the present disclosure and an external case 20 which supports the organic light emitting display apparatus 10.

The organic light emitting display apparatus according to an embodiment of the present disclosure, as illustrated in FIGS. 1 to 4, may include a display area AA displaying an image and a non-display area NAA provided outside the display area AA. The display area AA may include an organic light emitting display panel 100 including a transparent area AA1 which transmits light and an opaque area AA2 which does not transmit light, a camera 600 which is provided in the transparent area AA1 in a rear surface of the organic light emitting display panel 100 and photographs a region in a forward direction with respect to the organic light emitting display panel 100, a gate driver 200 which sequentially supplies a gate pulse to a plurality of gate lines GL1 to TGLg included in the organic light emitting display panel 100, a data driver 300 which supplies data voltages to a plurality of data lines DL1 to DLd included in the organic light emitting display panel 100, an initialization circuit 500 (which may be referred to herein as an initialization unit 500) which transfers gate pulses, output from the gate driver 200, to a plurality of transparent area gate lines TGLg-4 to TGLg included in the transparent area AA1 among the plurality of gate lines GL1 to TGLg or transfers, to the transparent area gate lines TGLg-4 to TGLg, initialization control signals for initializing first pixel driving circuits provided in the transparent area AA1, and a controller 400 which controls driving of the gate driver 200, the initialization unit 500, and the data driver 300. The first pixel driving circuit provided in the transparent area AA1 and the second pixel driving circuit provided in the opaque area AA2 may have different structures, and particularly, the number of transistors included in the first pixel driving circuit may be set to be less than the number of transistors included in the second pixel driving circuit. The initialization unit 500 may include any circuitry suitable to perform the various operations described herein with respect to the initialization unit 500.

The camera 600 may be provided between the external case 20 and the organic light emitting display panel 100 and may be driven based on control by the controller 400 or control by an external system 800 which controls driving of the electronic device. The camera 600 may be provided in the rear surface of the organic light emitting display panel 100 and may perform a function of photographing a region in a forward direction with respect to the organic light emitting display panel 100. Here, the forward direction with respect to the organic light emitting display panel 100 may denote a direction in which the organic light emitting display panel 100 displays an image.

The controller 400, as illustrated in FIG. 3, may include a data aligner 430 which realigns input video data Ri, Gi, and Bi transferred from the external system 800 by using a timing synchronization signal TSS transferred from the external system 800 to generate image data Data and supplies the image data Data to the data driver 300, a control signal generator 420 which generates a gate control signal GCS and a data control signal DCS by using the timing synchronization signal TSS, an input unit 410 which receives the timing synchronization signal TSS and the input video data Ri, Gi, and Bi from the external system 800, transfers the input video data Ri, Gi, and Bi to the data aligner 430, and transfers the timing synchronization signal TSS to the control signal generator 420, and an output unit 440 which outputs the image data Data generated by the data aligner 430 to the data driver 300, transfers the data control signal DCS generated by the control signal generator 420 to the data driver 300, and transfers the gate control signal GCS generated by the control signal generator 420 to the gate driver 200. The control signal generator 420 may generate a first turn-on control signal ALL_L for controlling the initialization unit 500 by using the timing synchronization signal TSS. However, the present embodiment is not limited thereto, and in other embodiments, the first turn-on control signal ALL_L may be generated by the gate driver 200.

The gate driver 200 may be configured as an integrated circuit (IC), and then, may be mounted in the non-display area NAA or may be directly embedded into the non-display area NAA.

The gate driver 200, as illustrated in FIG. 4, may include first to $g^{th}$ stages ST1 to STg.

Each of the first to $g^{th}$ stages ST1 to STg may generate a gate signal VG and an emission signal EM, output the gate signal to a gate line GL, and output the emission signal EM to an emission line.

For example, the first stage ST1 driven by a gate start signal transferred from the controller 400 may generate a first gate signal VG1 by using at least one gate clock transferred from the controller 400 and may output the first gate signal VG1 to a first gate line GL1. Also, the first stage ST1 may be driven by an emission start signal transferred from the controller 400 to generate a first emission signal EM1 by using at least one emission clock transferred from the controller 400 and may output the first emission signal EM1 to a first emission line which is arranged in parallel with the first gate line GL1.

In this case, the first gate signal VG1 and the first emission signal EM1 may drive the second stage ST2, and thus, the second stage ST2 may generate a second gate signal VG2 and a second emission signal EM2 and may respectively output the second gate signal VG2 and the second emission signal EM2 to a second gate line GL2 and a second emission line which is arranged in parallel with the second gate line GL2.

Moreover, the g-$1^{th}$ gate signal VGg-1 and the g-$1^{th}$ emission signal EMg-1 each output from the g-$1^{th}$ stage STg-1 may drive the $g^{th}$ stage STg. Therefore, the $g^{th}$ stage STg may generate a $g^{th}$ gate signal VGg and a $g^{th}$ emission signal EMg and may respectively output the $g^{th}$ gate signal VGg and the $g^{th}$ emission signal EMg to a $g^{th}$ gate line GLg and a $g^{th}$ emission line which is arranged in parallel with the $g^{th}$ gate line GLg.

In this case, in the present disclosure, an order in which the first to $g^{th}$ gate signals VG1 to VGg and the first to $g^{th}$ emission signals EM1 to EMg are output is not limited to the above-described order. Therefore, in the present disclosure, an order in which the first to $g^{th}$ gate signals VG1 to VGg and the first to $g^{th}$ emission signals EM1 to EMg are output may be variously changed.

Moreover, a structure of each of the stages ST1 to STg for outputting the first to $g^{th}$ gate signals VG1 to VGg and the first to $g^{th}$ emission signals EM1 to EMg may be variously designed by using stages for generating gate signals and emission signals, which are being used currently and generally. That is, the structure of each of the stages ST1 to STg may be implemented as various types by using structures of stages which are being used currently.

To provide an additional description, the feature of the present disclosure may be a feature where a structure of each of the stages ST1 to STg for generating the gate signals VG1 to VGg and the emission signals EM1 to EMg on the basis of the above-described order is implemented as various types by those skilled in the art, instead of a structure of each of the stages ST1 to STg for generating the gate signals VG1 to VGg and the emission signals EM1 to EMg.

The data driver 300 may be equipped in a chip-on film attached on the organic light emitting display panel 100. The chip-on film may be connected to a main board including the controller 400. However, the data driver 300 may be directly mounted on the organic light emitting display panel 100 and may be electrically connected to the main board. The data driver 300 may convert the image data Data, transferred from the controller 400, into data voltages and may output the data voltages to the data lines DL1 to DLd.

The external system 800 may perform a function of driving the controller 400 and the electronic device. That is, when the electronic device is a smartphone, the external system 800 may receive various voice information, video information, and letter information over a wireless communication network and may transfer the video information to the controller 400. In the following description, the video information transferred from the external system 800 to the controller 400 may be referred to as input video data. Also, the external system 800 may execute an application for controlling the camera 600. The application may be downloaded to the external system 800 as an application (App) type, and then, may be executed by the external system 800.

The organic light emitting display panel 100 may include a plurality of pixels 110 which each include an organic light emitting diode (OLED) and a pixel driving circuit for driving the OLED. Also, the organic light emitting display panel 100 may include a plurality of signal lines which define a pixel area, where the pixels 110 are provided, and supply a driving signal to the pixel driving circuit. The signal lines may include various kinds of lines, in addition to the gate lines GL1 to TGLg and the data lines DL1 to DLd.

In the following description, gate lines provided in the transparent area AA1 among the gate lines GL1 to TGLg may be referred to as transparent area gate lines, and gate lines provided in the opaque area AA2 among the gate lines GL1 to TGLg may be referred to as opaque area gate lines. The transparent area gate lines may be referred to by reference numeral TGL, and the opaque area gate lines may be referred to by reference numeral GL. That is, a transparent area gate line among gate lines referred to by reference numeral GL may be referred to by reference numeral TGL.

For example, in the organic light emitting display apparatus illustrated in FIG. 2, first to g-5$^{th}$ gate lines GL1 to GLg-5 may be referred to as opaque area gate lines, and g-4$^{th}$ to g gate lines TGLg-4 to TGLg may be referred to as transparent area gate lines.

Moreover, pixels provided in the transparent area among the pixels 110 may be referred to as first pixels, and pixels provided in the opaque area among the pixels 110 may be referred to as second pixels.

In this case, each of the first pixels may include a first pixel driving circuit and a first OLED, and each of the second pixels may include a second pixel driving circuit and a second OLED.

The organic light emitting display panel 100, as illustrated in FIGS. 1 and 2, may include the display area AA displaying an image and the non-display area NAA provided outside the display area AA.

The display area AA may include a transparent area AA1 which transmits light and an opaque area AA2 which does not transmit light. The camera 600, which photographs a region in the forward direction with respect to the organic light emitting display panel 100, may be disposed at a portion, corresponding to the transparent area AA1, of the rear surface of the organic light emitting display panel 100.

The transparent area AA1 may be implemented to be transparent so that external light travels to the inside of the camera 600.

The opaque area AA2 may not need to transmit external light, and thus, may be implemented to be opaque. However, the opaque area AA2 may also be implemented to be transparent.

The non-display area NAA may be provided outside the display area AA.

A width of the non-display area NAA may be formed to be very small, and then, when the most of the non-display area NAA is covered by the external case 20, only the display area AA may be exposed at a front surface of the electronic device as illustrated in FIG. 1.

Each of the first pixels provided in the transparent area AA1 may include the first pixel driving circuit including three transistors and a first OLED connected to the first pixel driving circuit, for performing internal compensation.

Each of the second pixels provided in the opaque area AA2 may include the second pixel driving circuit including at least four transistors and a second OLED connected to the second pixel driving circuit, for performing internal compensation.

A detailed configuration of each of the first and second pixels will be described below in detail with reference to FIGS. 5 to 8.

Figure 5:
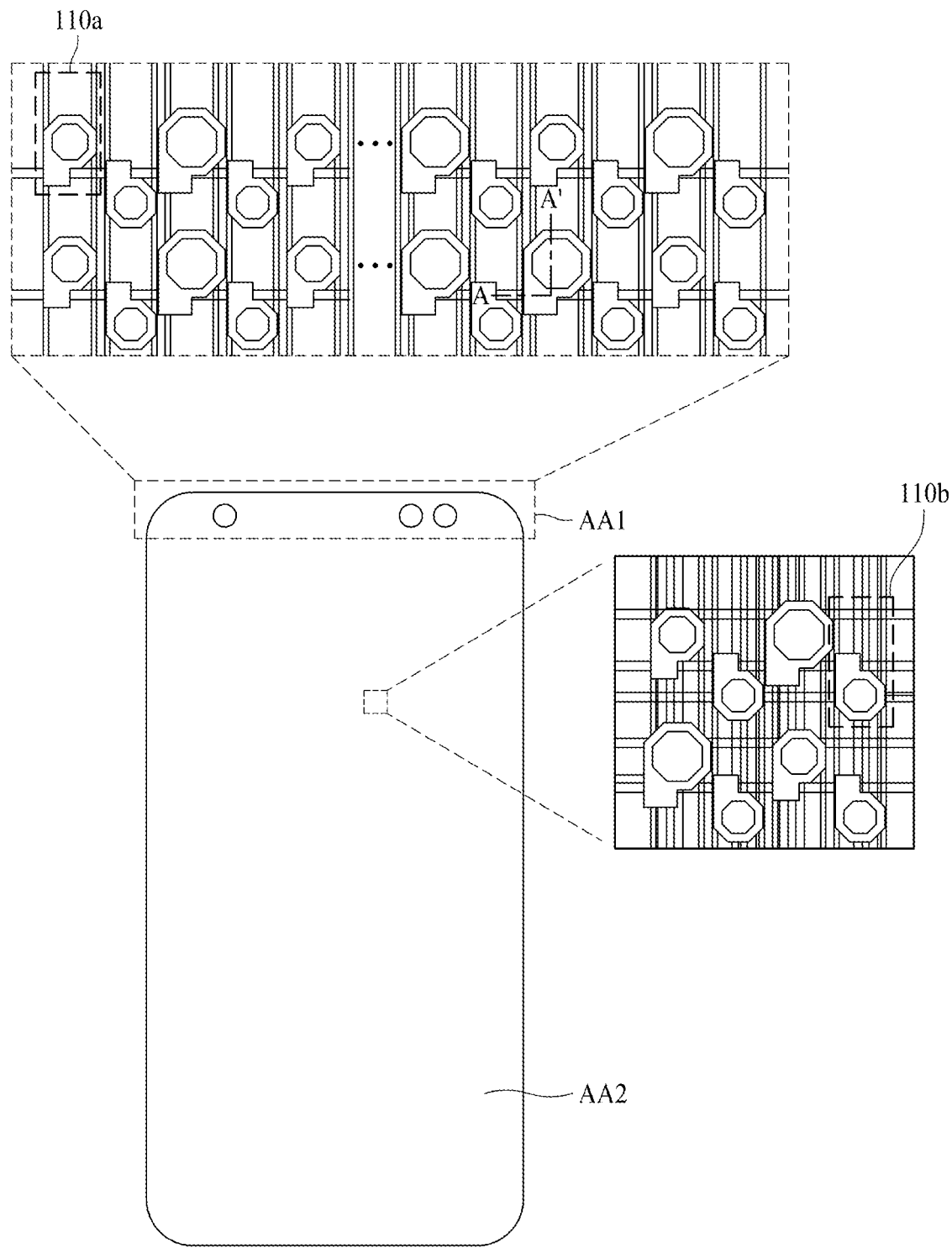
FIG. 5 is an exemplary diagram illustrating a first pixel and a second pixel each included in an organic light emitting display apparatus according to an embodiment of the present disclosure.
Figure 6:
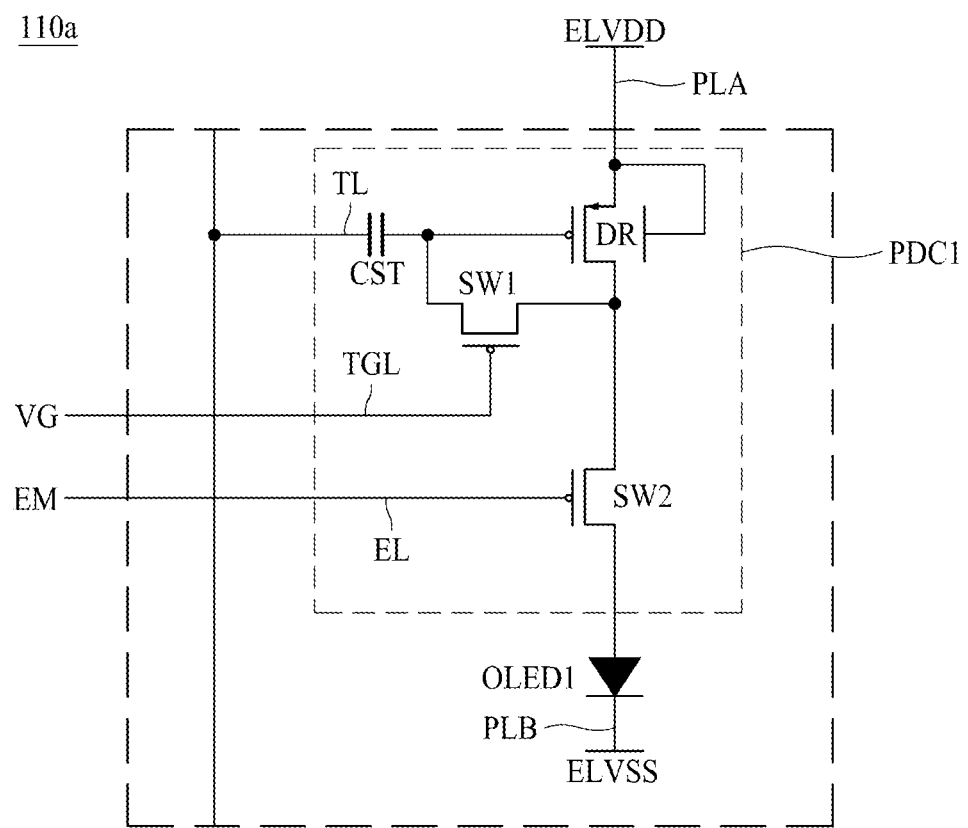
FIG. 6 is an exemplary diagram illustrating a structure of a first pixel applied to an organic light emitting display apparatus according to an embodiment of the present disclosure.
Figure 7:
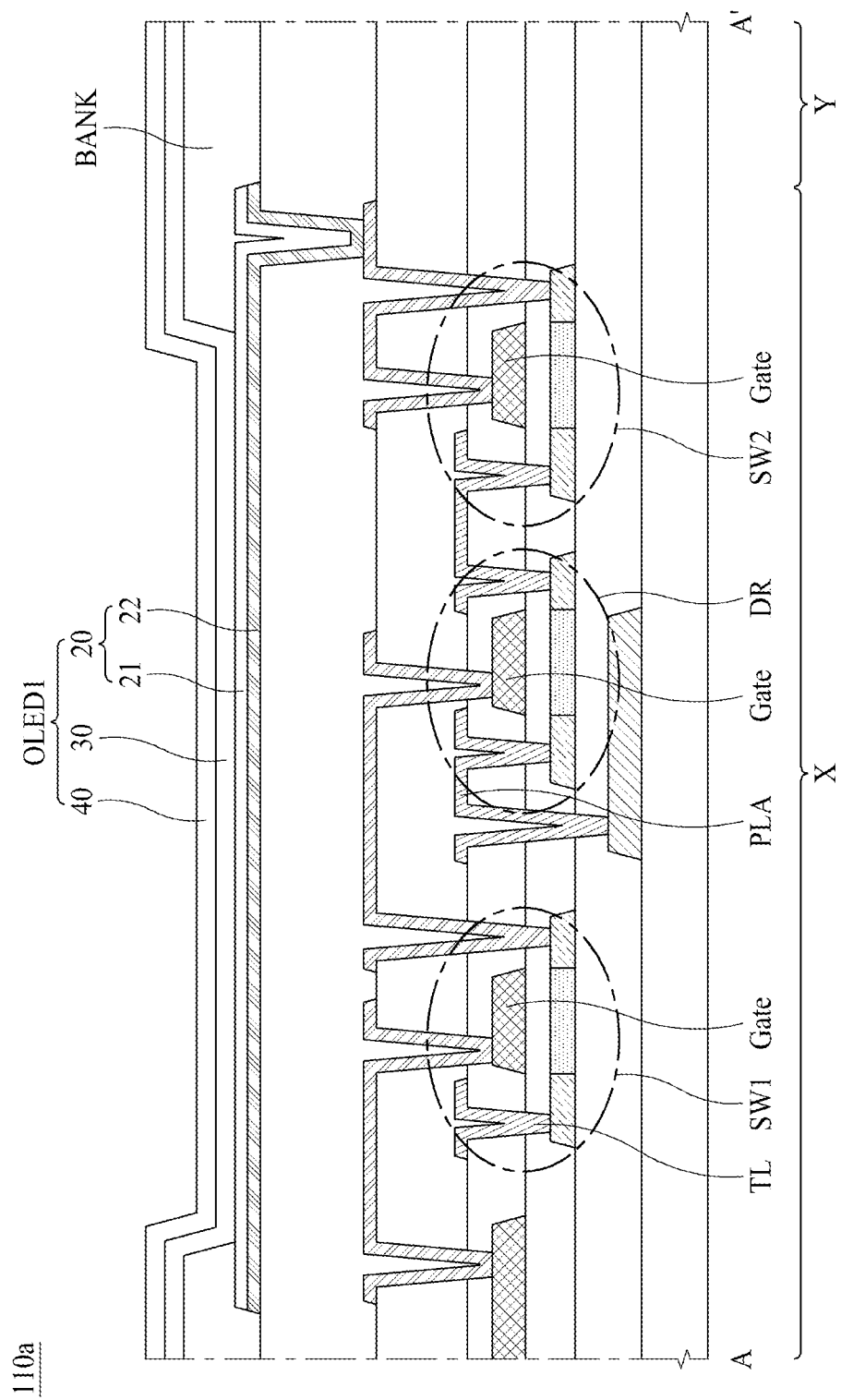
FIG. 7 is a cross-sectional view illustrating a structure of a first pixel applied to an organic light emitting display apparatus according to an embodiment of the present disclosure.
Figure 8:
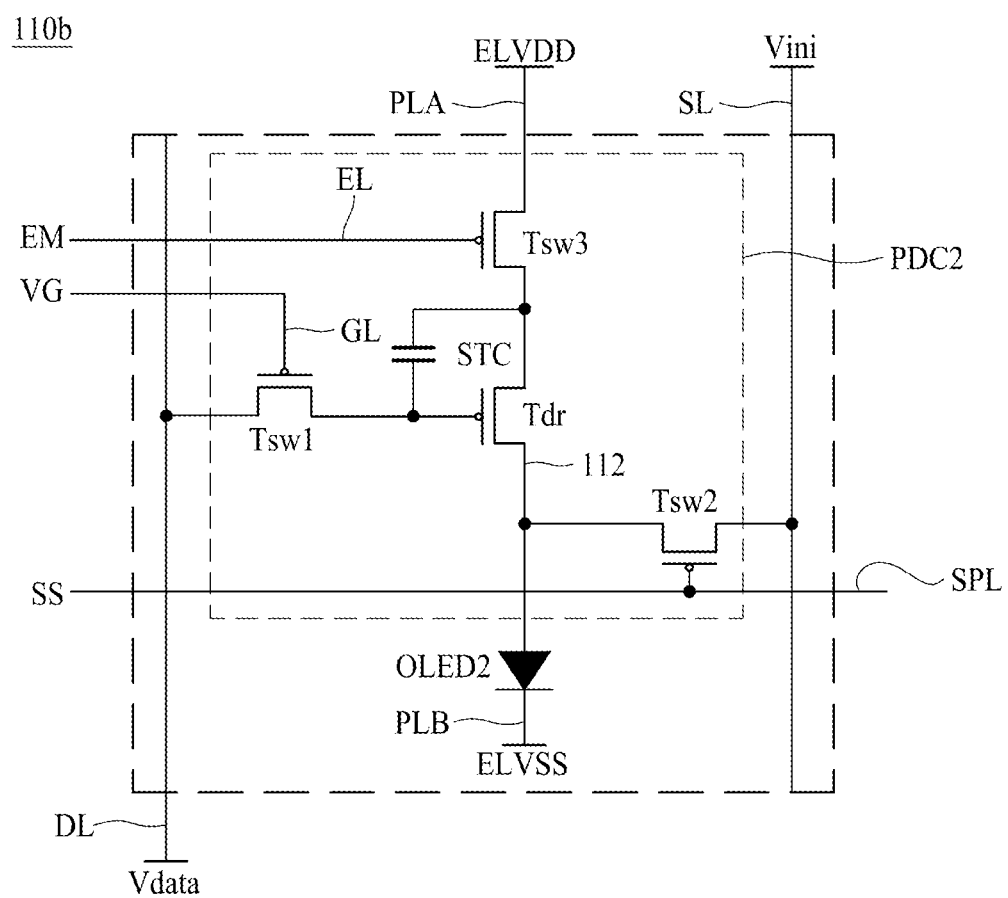
FIG. 8 is an exemplary diagram illustrating a structure of a second pixel applied to an organic light emitting display apparatus according to an embodiment of the present disclosure.

FIG. 5 is an exemplary diagram illustrating a first pixel and a second pixel each included in an organic light emitting display apparatus according to an embodiment of the present disclosure, FIG. 6 is an exemplary diagram illustrating a structure of a first pixel applied to an organic light emitting display apparatus according to an embodiment of the present disclosure, FIG. 7 is a cross-sectional view illustrating a structure of a first pixel applied to an organic light emitting display apparatus according to an embodiment of the present disclosure, and FIG. 8 is an exemplary diagram illustrating a structure of a second pixel applied to an organic light emitting display apparatus according to an embodiment of the present disclosure.

The display area AA of the organic light emitting display panel 100 may include a plurality of pixels 110 which includes an organic light emitting diode OLED and a pixel driving circuit PDC for driving the organic light emitting diode OLED. As described above, pixels provided in the transparent area AA1 among the pixels 110 may be referred to as first pixels 110a, and pixels provided in the opaque area AA2 among the pixels 110 may be referred to as second pixels 110b. In this case, each of the first pixels 110a may include a first pixel driving circuit PDC1 and a first organic light emitting diode OLED1 as illustrated in FIG. 6, and each of the second pixels 110b may include a second pixel driving circuit PDC2 and a second organic light emitting diode OLED2 as illustrated in FIG. 8.

Moreover, the organic light emitting display panel 100 may include a plurality of signal lines which define a plurality of pixel areas, where the pixels 110 are respectively provided, and supply a driving signal to the pixel driving circuit PDC.

Hereinafter, the signal lines applied to the first pixel 110a and the second pixel 110b will be described first, a structure of the first pixel 110a will be described with reference to FIGS. 6 and 7, and a structure of the second pixel 110b will be described with reference to FIG. 8.

First, the signal lines may include a gate line GL, a data line DL, a sensing pulse line SPL, a sensing line SL, a first driving voltage line PLA, a second driving voltage line PLB, an emission line EL, a reference voltage supply line, and a transfer line TL through which a reference voltage or a data voltage is supplied.

A plurality of gate lines GL, as illustrated in FIG. 2, may be arranged at certain intervals in a second direction (for example, a widthwise direction) of the organic light emitting display panel 100. A gate line included in the first pixel 110a illustrated in FIG. 6 may be referred to as a transparent area gate line TGL.

A plurality of sensing pulse lines SPL, as illustrated in FIG. 8, may be arranged at certain intervals in parallel with the gate lines GL.

A plurality of data lines DL, as illustrated in FIGS. 2, 6, and 8, may be arranged at certain intervals in a first direction (for example, a length wise direction) of the organic light emitting display panel 100 to intersect with the gate lines GL and the sensing pulse lines SPL.

A plurality of sensing lines SL, as illustrated in FIG. 8, may be arranged at certain intervals in parallel with the data lines DL.

The first driving voltage line PLA, as illustrated in FIGS. 6 and 8, may be provided apart from the data line DL and the sensing line SL by a certain interval in parallel with the data line DL and the sensing line SL. The first driving voltage line PLA may be connected to the gate driver 200 or a power supply 700 illustrated in FIG. 2 and may transfer a first driving voltage ELVDD, supplied from the power supply 700, to each pixel 110.

The second driving voltage line PLB, as illustrated in FIGS. 6 and 8, may transfer a second driving voltage ELVSS, supplied from the power supply unit 700, to each of the pixels 110.

The emission lines EL, as illustrated in FIGS. 6 and 8, may be arranged in parallel with the gate lines GL. The emission lines EL may supply an emission signal EM, transferred from the gate driver 200, to each pixel 110.

A reference voltage, which is to be supplied to each of the first pixels 110a, may be supplied to the reference voltage supply line. The reference voltage may be supplied from the power supply 700.

The transfer line TL, as illustrated in FIG. 6, may be connected to the first pixel 110a. The transfer line TL may supply the first pixel 110a with the reference voltage supplied through the reference voltage supply line or a data voltage supplied through the data line DL.

A plurality of first pixels 110a may be provided in the transparent area AA1, and each of the first pixels 110a, as illustrated in FIG. 6, may include a first pixel driving circuit PDC1 and a first organic light emitting diode OLED1.

The first pixel driving circuit PDC1 may include a capacitor CST including a first terminal connected to the transfer line TL through which the reference voltage or a data voltage Vdata is transferred, a driving transistor DR including a first terminal connected to the first driving voltage line PLA and a gate connected to a second terminal of the capacitor CST, a first transistor SW1 including a first terminal connected to the gate of the driving transistor DR, a second terminal connected to the second terminal of the driving transistor DR, and a gate connected to the transparent area gate line TGL, and a second transistor SW2 including a first terminal connected to the second terminal of the driving transistor DR, a second terminal connected to the first organic light emitting diode OLED1, and a gate connected to an emission control line EL.

A detailed driving method of the pixel driving circuit PDC1 will be described below in detail with reference to FIGS. 9 to 16.

A cross-sectional structure of the first pixel 110a including the first pixel driving circuit PDC1 is illustrated in FIG. 7. FIG. 7 illustrates a cross-sectional surface taken along line A-A' illustrated in the transparent area of FIG. 5. In the cross-sectional structure of the first pixel 110a illustrated in FIG. 7, each of layers other than below-described portions may include an organic material, an inorganic material, or a mixture layer thereof and may perform a function of an insulator or a planarization layer.

A plurality of metal lines included in the first pixel 110a may be formed of transparent metal such as indium tin oxide (ITO).

The first organic light emitting diode OLED1 may include an anode 20, a light emitting layer 30, and a cathode 40. The cathode 40 may be formed of transparent metal. The anode 20 may be formed of a double layer including transparent metal 21 and silver (Ag) 22, but the silver 22 may be omitted for enhancing a transmittance.

The capacitor CST may include metal included in each of the data line DL and the first driving voltage line PLA and metal included in each of the first transistor SW1, the second transistor SW2, and a gate of the driving transistor DR.

Various organic materials (for example, a material included in a bank, a material included in an insulation layer, and a material included in a planarization layer) included in the first pixel 110a may be formed of a transparent material.

As described above, since the number of transistors included in the first pixel driving circuit PDC1 is three, a region X, where the first pixel driving circuit PDC1 is disposed, of the first pixel 110a may decrease, and thus, a size of a transparent portion of the first pixel 110a may relatively increase.

Moreover, the number of transistors included in the first pixel driving circuit PDC1 may be small and the region X with the first pixel driving circuit PDC1 disposed therein may include a transparent material, and thus, a transmittance of the region X with the first pixel driving circuit PDC1 disposed therein may more increase than that of a region with the second pixel driving circuit PDC2 disposed therein Therefore, comparing with the second pixel 110b, a transmittance of the first pixel 110a may increase, and thus, the amount of light transferred to the camera 600 through the first pixel 110a may increase.

In this case, a density (pixel per inch (PPI)) of the first pixels 110a included in the transparent area AA1 may be set to be equal to a density (PPI) of the second pixels 110b included in the opaque area AA2.

Finally, the second pixels 110b may be provided in the opaque area AA2, and as illustrated in FIG. 8, each of the second pixels 110b may include a second pixel driving circuit PDC2 and a second organic light emitting diode OLED2.

The second pixel driving circuit PDC2 may include at least four transistors, for performing internal compensation. That is, the number (four or more) of transistors included in the second pixel driving circuit PDC2 may be set to be greater than the number (three) of transistors included in the first pixel driving circuit PDC1.

For example, as illustrated in FIG. 8, the second pixel driving circuit PDC2 may include a driving transistor Tdr which controls the amount of current flowing in the second organic light emitting diode OLED2, a switching transistor Tsw1 which includes a first terminal connected to the data line DL, a second terminal connected to a gate of the driving transistor Tdr, and a gate connected to the gate line GL, an emission transistor Tsw3 which includes a first terminal connected to the first driving voltage line PLA, a second terminal connected to the first terminal of the driving transistor Tdr, and a gate connected to the emission line EL, for controlling a current flowing to the driving transistor Tdr, a storage capacitor STC which is connected to the second terminal of the emission transistor Tsw3 and the gate of the driving transistor Tdr, and a sensing transistor Tsw2 which includes a first terminal connected to the second terminal of the driving transistor Tdr, a second terminal connected to a sensing line SL, and a gate connected to a sensing pulse line SPL.

A current supplied to the second organic light emitting diode OLED2 through the second pixel driving circuit PDC2 may be proportional to the square $((Vgs-Vth)^2)$ of a difference voltage between a gate-source voltage Vgs of the driving transistor Tdr and a threshold voltage Vth of the driving transistor Tdr.

In this case, the second pixel driving circuit PDC2 may use signals having various forms so as to remove the threshold voltage Vth from the square $((Vgs-Vth)^2)$ of the difference voltage.

When the threshold voltage Vth is removed from the square $((Vgs-Vth)^2)$ of the difference voltage, a current supplied to the second organic light emitting diode OLED2 may be maintained to be constant regardless of the threshold voltage Vth.

That is, even when the threshold voltage of the driving transistor Tdr included in the second pixel 110b is shifted because the organic light emitting display panel 100 is used for a long time, the second pixel driving circuit PDC2 may remove the threshold voltage Vth from the square $((Vgs-Vth)^2)$ of the difference voltage, a current corresponding to a data voltage Vdata may flow to the second organic light emitting diode OLED2.

To provide an additional description, the second pixel driving circuit PDC2 may perform a function of allowing a current corresponding to the data voltage Vdata to flow to the second organic light emitting diode OLED2, regardless of a shift of the threshold voltage of the driving transistor Tdr, and such a function may be referred to as internal compensation. The second pixel driving circuit PDC2 may be configured as various types including at least four transistors so as to perform internal compensation, and a driving method of the second pixel driving circuit PDC2 may be variously modified.

Figure 9:
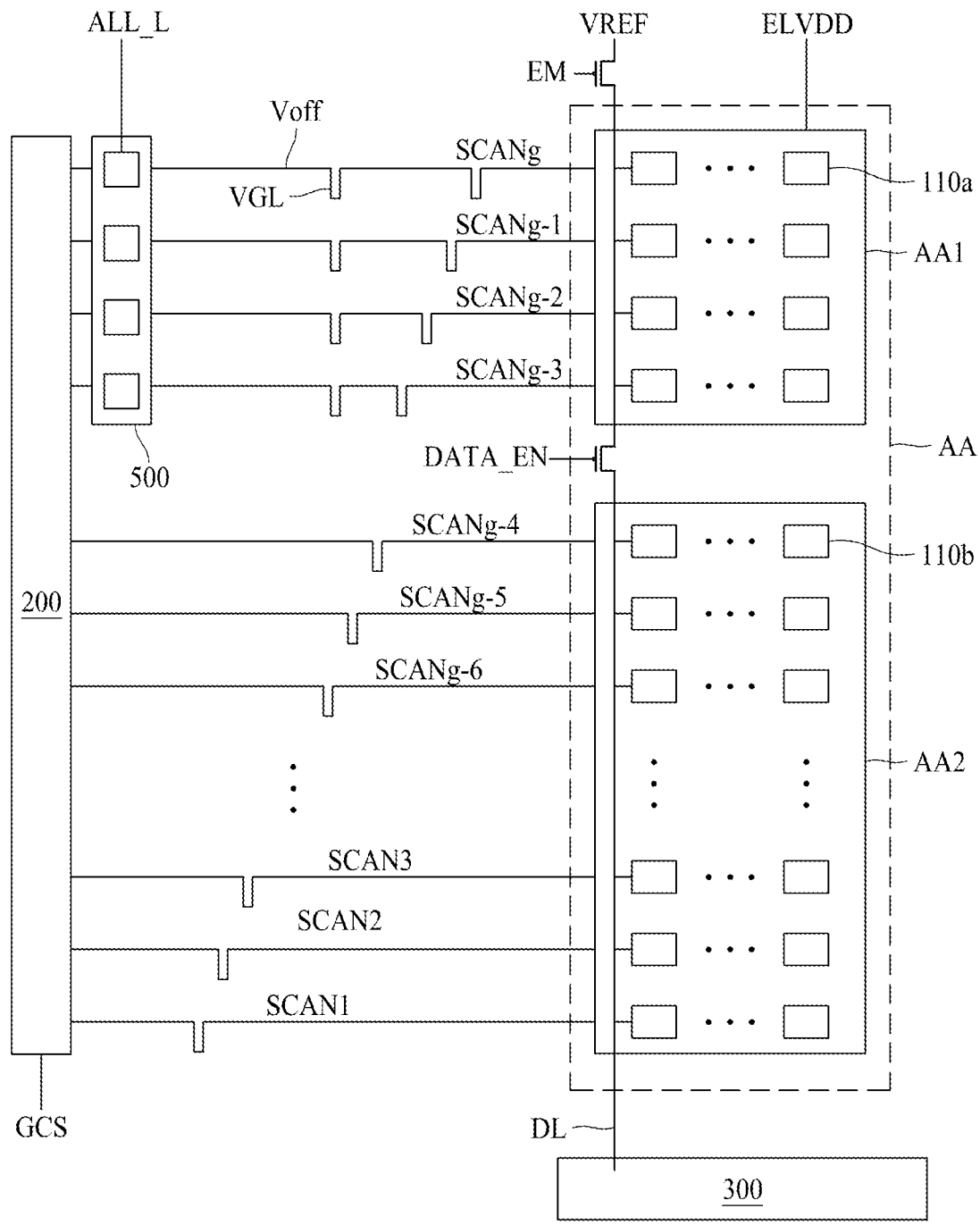
FIG. 9 is an exemplary diagram illustrating a gate driver, an initialization unit, and a transparent area each applied to an organic light emitting display apparatus according to an embodiment of the present disclosure.
Figure 10:
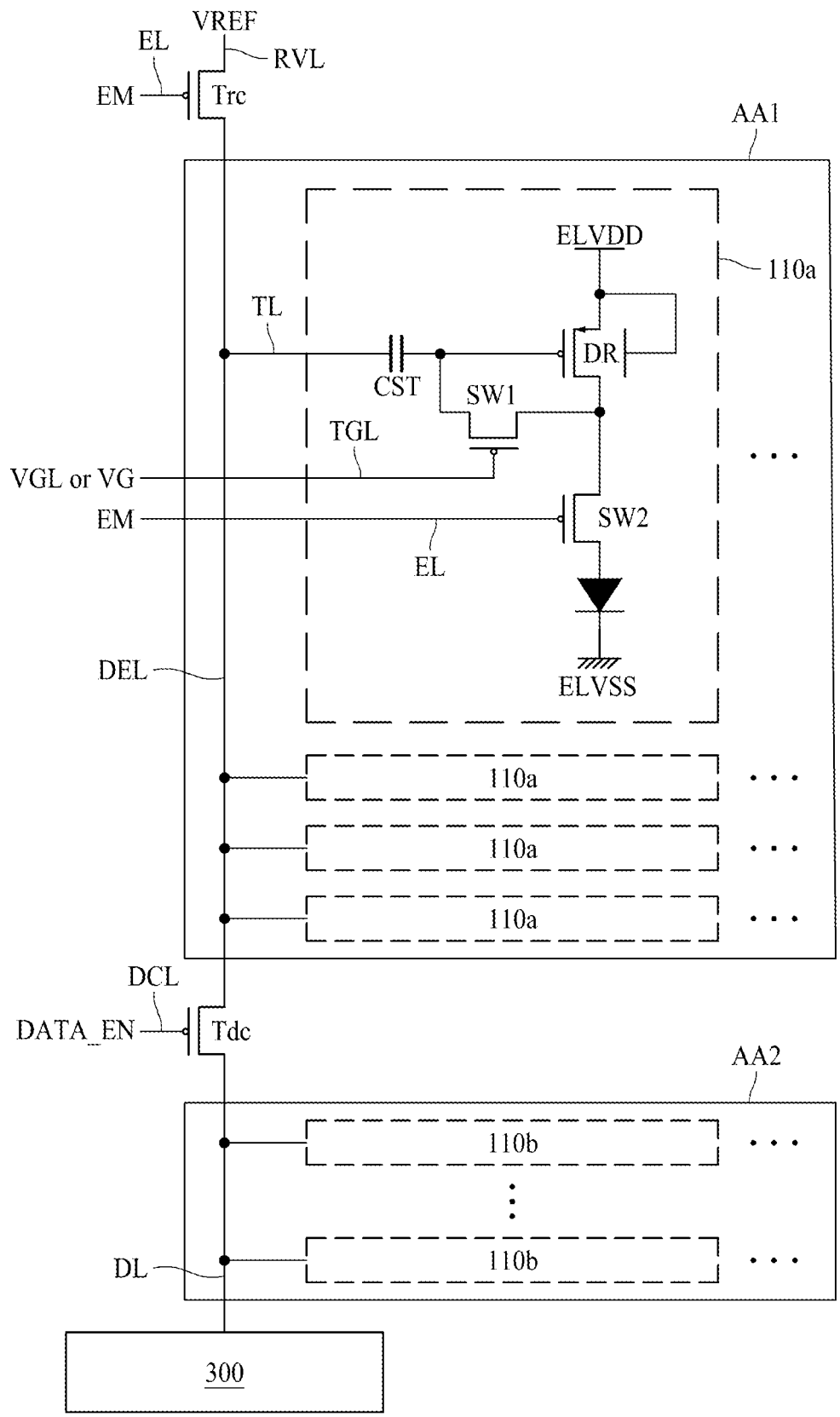
FIG. 10 is an exemplary diagram illustrating a structure where a first pixel applied to the present disclosure is connected to a data line and a reference voltage supply line.
Figure 11:
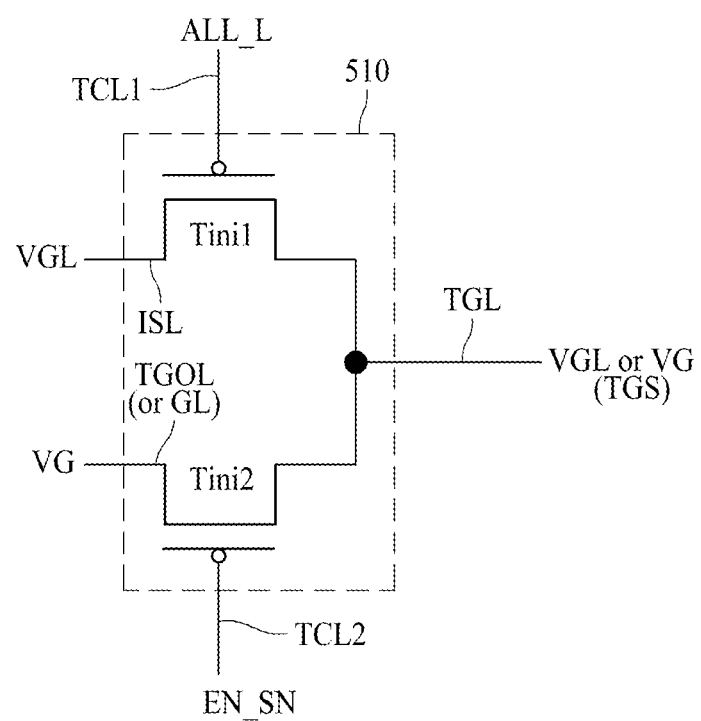
FIG. 11 is an exemplary diagram illustrating a structure of an initialization unit applied to the present disclosure.
Figure 12:
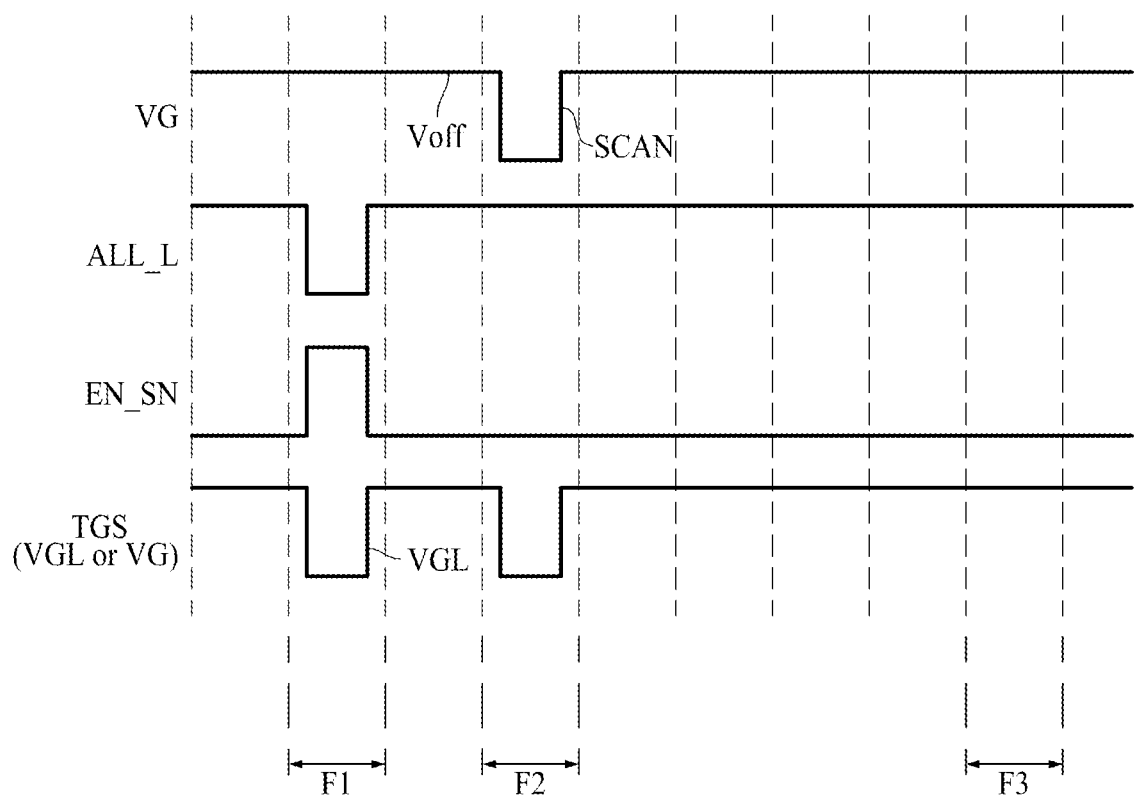
FIG. 12 is an exemplary diagram showing waveforms of signals applied to an initialization unit applied to the present disclosure.

FIG. 9 is an exemplary diagram illustrating a gate driver, an initialization unit, and a transparent area each applied to an organic light emitting display apparatus according to an embodiment of the present disclosure, FIG. 10 is an exemplary diagram illustrating a structure where a first pixel applied to the present disclosure is connected to a data line and a reference voltage supply line, FIG. 11 is an exemplary diagram illustrating a structure of an initialization unit applied to the present disclosure, and FIG. 12 is an exemplary diagram showing waveforms of signals applied to an initialization unit applied to the present disclosure. In FIG. 9, gate pulses supplied to the first pixel 110a and the second pixel 110b are illustrated.

As described above, the organic light emitting display apparatus according to an embodiment of the present disclosure may include the organic light emitting display panel 100 including the first pixels 110a and the second pixels 110b, the gate driver 200, the data driver 300, the initialization unit 500, and the controller 400.

The transparent area AA1, as illustrated in FIGS. 2 and 5, may be formed from one end of the display area AA to the other end of the display area AA. For example, as illustrated in FIGS. 2 and 5, the transparent area AA1 may be provided between a first non-display area NAA1 including the gate driver 200 and a second non-display area NAA2 facing the first non-display area NAA1 in the non-display area NAA.

In this case, the initialization unit 500 may be provided in the first non-display area NAA1 along with the gate driver 200, or may be included in the gate driver 200. When the initialization unit 500 is separated from the gate driver 200, the initialization unit 500 may be provided between the gate driver 200 and the transparent area AA1.

The initialization unit 500, as illustrated in FIGS. 9 to 11, may transfer gate pulses SCANg-3 to SCANg, output from the gate driver 200, to transparent area gate lines TGL provided in the transparent area AA1 among the plurality of gate lines or may transfer, to the transparent area gate lines TGL, initialization control signals VGL for initializing the first pixel driving circuits provided in the transparent area AA1.

To this end, the initialization unit 500 may include a plurality of first initialization drivers 510 connected to the transparent area gate lines TGL.

Each of the first initialization drivers 510, as illustrated in FIG. 11, may include a first initialization transistor Tini1, which includes a first terminal connected to an initialization control signal supply line ISL, a second terminal connected to the transparent area gate line TGL, and a gate connected to a first turn-on control line TCL1, and a second initialization transistor Tini2 which includes a first terminal connected to a transparent area gate output line TGOL of the gate driver 200, a second terminal connected to the transparent area gate line TGL, and a gate connected to a second turn-on control line TCL2.

In this case, as illustrated in FIG. 12, a phase of a first turn-on control signal ALL_L supplied through the first turn-on control line TCL1 may be set to be opposite to a phase of a second turn-on control signal EN_SN supplied through the second turn-on control line TCL2.

The first turn-on control signal ALL_L and the second turn-on control signal EN_SN may be generated by the controller 400, or may be generated by the gate driver 200 on the basis of the gate control signal GCS.

The initialization control signal VGL supplied through the initialization control signal supply line ISL may have a voltage for turning on the first transistor SW1.

For example, as illustrated in FIG. 10, when the first transistor SW1 is formed as a P-type transistor, the initialization control signal VGL may be a low voltage.

The initialization control signal VGL may be generated by the controller 400, or may be generated by the gate driver 200 on the basis of the gate control signal GCS.

Referring to FIGS. 11 and 12, when the first turn-on control signal ALL_L is logic low and the second turn-on control signal EN_SN is logic high, the first initialization driver 510 may output the initialization control signal VGL (i.e., a low voltage), and when the first turn-on control signal ALL_L is logic high and the second turn-on control signal EN_SN is logic low, the first initialization driver 510 may output the gate signal GL.

For example, when the first turn-on control signal ALL_L is logic low and the second turn-on control signal EN_SN is logic high, the first initialization transistor Tini1 may be turned on and the second initialization transistor Tini2 may be turned off. Therefore, the initialization control signal VGL (i.e., a low voltage) may be transferred to the transparent area gate line TGL through the first initialization transistor Tini1.

Moreover, when the first turn-on control signal ALL_L is logic high and the second turn-on control signal EN_SN is logic low, the first initialization transistor Tini1 may be turned off and the second initialization transistor Tini2 may be turned on. Therefore, the gate signal GL may be transferred to the transparent area gate line TGL through the second initialization transistor Tini2.

The gate signal VG may include a signal (hereinafter simply referred to as a gate pulse SCAN) for turning on the first transistor SW1 and a signal (hereinafter simply referred to as a gate-off signal Voff) for turning off the first transistor SW1.

To provide an additional description, as illustrated in FIGS. 9 and 12, in one frame period where the organic light emitting display panel displays one image, the initialization control signals VGL having a low voltage may be simultaneously transferred to the transparent area gate lines TGL and the first pixels 110a provided in the transparent area AA1 may be initialized by the initialization control signals VGL, in a period where one gate pulse is output.

As described above, the gate signal VG or the initialization control signal VGL may be supplied to the transparent area gate line TGL. The gate signal VG may include the gate pulse SCAN and the gate-off signal Voff.

A generic name for the gate signal VG or the initialization control signal VGL supplied to the transparent area gate line TGL may be a transparent area gate signal TGS. The transparent area gate signal TGS, as illustrated in FIG. 9, may include the initialization control signal VGL, the gate-off signal Voff, and the gate pulse SCAN.

A first terminal of the capacitor CST included in the first pixel driving circuit PDC1, as illustrated in FIGS. 9 and 10, may be connected to a reference voltage control transistor Trc and a data voltage control transistor Tdc.

A first terminal of the reference voltage control transistor Trc may be connected to a reference voltage supply line RVL through which a reference voltage VREF is supplied, a second terminal thereof may be connected to the first terminal of the capacitor CST, and a gate thereof may be connected to an emission line EL through which an emission signal EM is supplied.

A first terminal of the data voltage control transistor Tdc may be connected to the first terminal of the capacitor CST, a second terminal thereof may be connected to the data driver 300, and a gate thereof may be connected to a data control line DCL through which a data control signal DATA_EN is supplied.

A data extension line DEL provided between the second terminal of the reference voltage control transistor Trc and the first terminal of the data voltage control transistor Tdc may be connected to a plurality of transfer lines TL which are connected to first pixels 110a provided along data extension lines DEL.

A data line DL provided between the data voltage control transistor Tdc and the data driver 300 may be connected to a plurality of opaque area gate lines GL which are connected to second pixels 110b provided along the data line DL.

Hereinafter, a method of performing internal compensation by using the first pixel driving circuit PDC1 will be described with reference to FIGS. 1 to 16.

Figure 13:
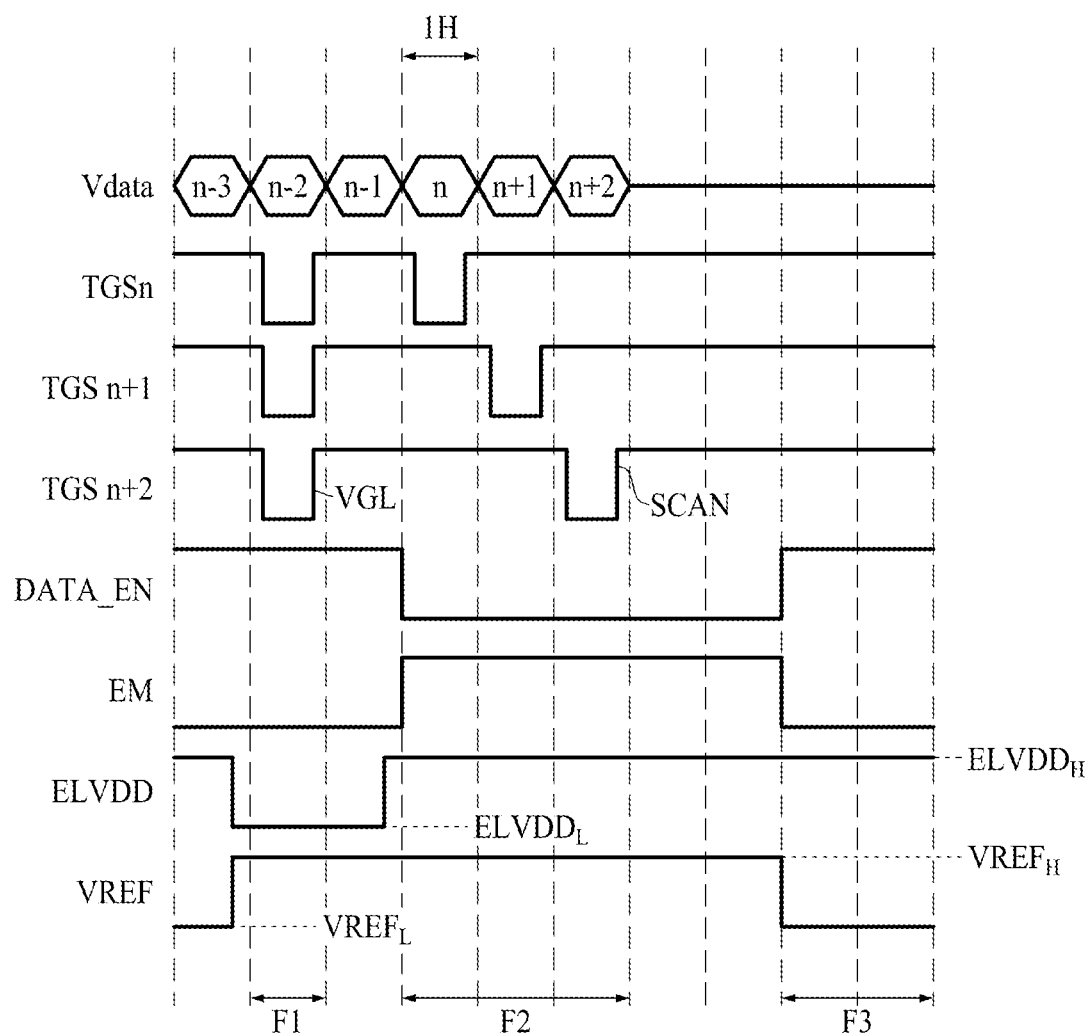
FIG. 13 is an exemplary diagram showing waveforms of signals applied to an organic light emitting display apparatus according to an embodiment of the present disclosure.
Figure 14:
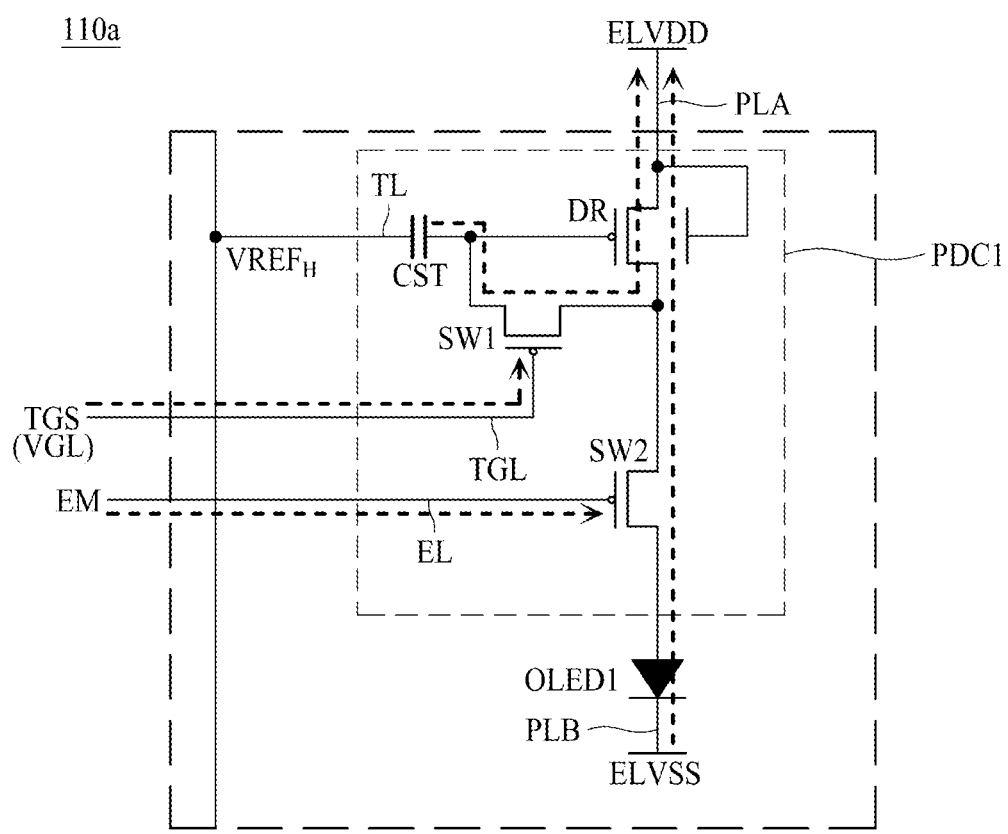
FIGS. 14 to 16 are exemplary diagrams illustrating a driving method of an organic light emitting display apparatus according to an embodiment of the present disclosure.
Figure 15:
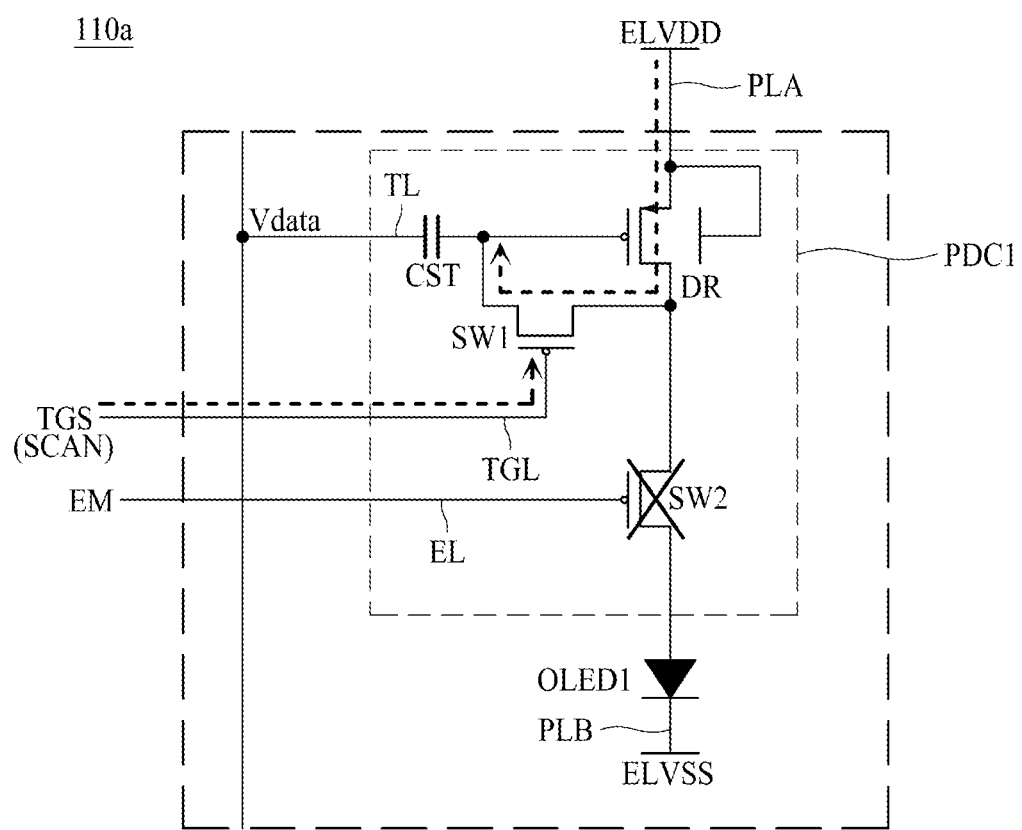
Figure 16:
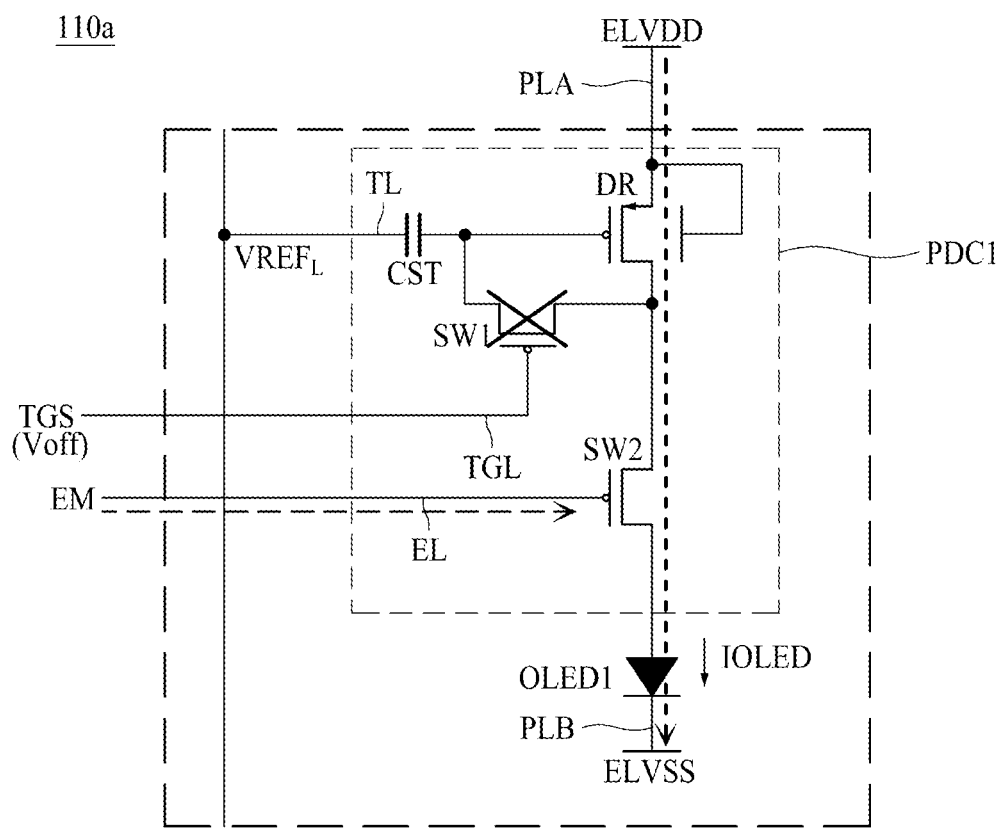

FIG. 13 is an exemplary diagram showing waveforms of signals applied to an organic light emitting display apparatus according to an embodiment of the present disclosure, and FIGS. 14 to 16 are exemplary diagrams illustrating a driving method of an organic light emitting display apparatus according to an embodiment of the present disclosure.

First, as illustrated in FIGS. 12 to 14, in a first period F1, the transparent area gate signals TGS having a low level may be supplied to the transparent area gate lines TGL. The transparent area gate signals TGS having a low level may be supplied to gates of the first transistors SW1 included in the first pixel driving circuits PDC1. Therefore, the first transistors SW1 may be turned on. The supply of the transparent area gate signals TGS having a low level to the transparent area gate lines TGL may denote that the first initialization transistor Tini1 illustrated in FIG. 11 are turned on by the first turn-on control signal ALL_L, and thus, the initialization control signal VGL having a low level is supplied to the transparent area gate line TGL.

In this case, the first driving voltage ELVDD may also have a low level, and thus, the driving transistor DR may also be turned on. A low level of the first driving voltage ELVDD may be equal to or less than the second driving voltage ELVSS.

The data control signal DATA_EN may have a high level and the emission signal EM may have a low level, and thus, the data voltage control transistor Tdc may be turned off and the reference voltage control transistor Trc may be turned on. Therefore, a reference voltage VREF may be supplied to the first terminal of the capacitor CST through the reference voltage control transistor Trc. A reference voltage $VREF_H$ supplied through the reference voltage supply line RVL and the data voltage control transistor Tdc may have a high level.

Since the emission signal EM has a low level, the second transistor SW2 may also be turned on.

Therefore, a difference voltage ($=ELVDD_L - VREF_H$) between the first driving voltage $ELVDD_L$ and the reference voltage VREF may be charged into the capacitor CST, a voltage $V_G$ at the gate of the driving transistor DR may be the first driving voltage $ELVDD_L$, and a voltage $V_S$ at a source of the driving transistor DR may be the first driving voltage $ELVDD_L$.

Therefore, in the first period F1, the gate and the source of the driving transistor DR and the first organic light emitting diode OLED1 may be initialized to the first driving voltage $ELVDD_L$.

Subsequently, as illustrated in FIGS. 12, 13, and 15, in a second period F2, the transparent area gate signals TGS having a low level may be supplied to the transparent area gate lines TGL. The transparent area gate signals TGS having a low level may be supplied to gates of the first transistors SW1 included in the first pixel driving circuits PDC1. Therefore, the first transistors SW1 may be turned on. The supply of the transparent area gate signals TGS having a low level to the transparent area gate lines TGL may denote that the second initialization transistor Tini2 illustrated in FIG. 11 are turned on by the second turn-on control signal EN_SN, and thus, the gate pulse SCAN having a low level is supplied to the transparent area gate line TGL.

In this case, the first driving voltage ELVDD may have a high level.

The data control signal DATA_EN may have a low level and the emission signal EM may have a high level, and thus, the data voltage control transistor Tdc may be turned on and the reference voltage control transistor Trc may be turned off. Therefore, a data voltage Vdata may be supplied to the first terminal of the capacitor CST through the data voltage control transistor Tdc.

Since the emission signal EM has a high level, the second transistor SW2 may be turned off.

Therefore, a voltage (=ELVDD$_H$−|Vth|−Vdata) calculated by subtracting an absolute value of the threshold voltage Vth of the driving transistor DR and the data voltage Vdata from the first driving voltage ELVDD$_H$ may be charged into the capacitor CST, the voltage V$_G$ at the gate of the driving transistor DR may be a difference voltage (=ELVDD$_H$−|Vth|) between the first driving voltage ELVDD$_H$ and the absolute value of the threshold voltage Vth, and the voltage V$_S$ at the source of the driving transistor DR may be the first driving voltage ELVDD$_H$.

Therefore, in the second period F2, the threshold voltage Vth may be sensed, and the data voltage Vdata may be charged into the gate of the driving transistor DR.

Finally, as illustrated in FIGS. 12, 13, and 16, in a third period F3, the transparent area gate signals TGS having a high level may be supplied to the transparent area gate lines TGL. The transparent area gate signals TGS having a high level may be supplied to the gates of the first transistors SW1 included in the first pixel driving circuits PDC1. Therefore, the first transistors SW1 may be turned off. The supply of the transparent area gate signals TGS having a high level to the transparent area gate lines TGL may denote that the second initialization transistor Tini2 illustrated in FIG. 11 are turned on by the second turn-on control signal EN_SN, and thus, the gate-off signal Voff having a high level is supplied to the transparent area gate line TGL.

In this case, the first driving voltage ELVDD may have a high level. That is, the first driving voltage ELVDD$_H$ supplied to the transparent area AA1 may have a low level in the first period F1 and may have a high level in the third period F3. Therefore, a switch for transferring the first driving voltage ELVDD should be provided. The switch may be included in the power supply 700, and in a case where the first driving voltage ELVDD$_H$ is supplied through the gate driver 200, the switch may be included in the gate driver 200. A control signal for turning on the switch may be generated by the controller 400 and may be supplied to the switch. However, the first driving voltage ELVDD$_H$ having a certain level may be supplied to the opaque area AA2.

The data control signal DATA_EN may have a high level and the emission signal EM may have a low level, and thus, the data voltage control transistor Tdc may be turned off and the reference voltage control transistor Trc may be turned on. Therefore, the reference voltage VREF$_L$ having a low level may be supplied to the first terminal of the capacitor CST.

Since the emission signal EM has a high level, the second transistor SW2 may be turned on.

Therefore, the voltage (=ELVDD$_H$−|Vth|−Vdata) calculated by subtracting the absolute value of the threshold voltage Vth of the driving transistor DR and the data voltage Vdata from the first driving voltage ELVDD$_H$ may be charged into the capacitor CST, the voltage V$_G$ at the gate of the driving transistor DR may be a voltage (=ELVDD$_H$−|Vth|−Vdata+VREF$_L$) calculated by subtracting the absolute value of the threshold voltage Vth of the driving transistor DR and the data voltage Vdata from a sum of the first driving voltage ELVDD$_H$ and the reference voltage VREF$_L$, and the voltage V$_S$ at the source of the driving transistor DR may be the first driving voltage ELVDD$_H$.

In this case, a current I$_{OLED}$ flowing to the first organic light emitting diode OLED1 through the driving transistor DR may be expressed as the following Equation 1. In Equation 1, a may be a proportional constant.

$$I_{OLED} = a(V_{SG} - |V_{TH}|)^2 \qquad \text{Equation 1}$$
$$= a(Vdata - VREF_L)^2$$

That is, in the third period F3, the current I$_{OLED}$ flowing to the first organic light emitting diode OLED1 may be based on the data voltage Vdata and the reference voltage VREF$_L$ and may not be affected by a shift of the threshold voltage Vth of the driving transistor DR.

Therefore, even when the threshold voltage Vth of the driving transistor DR is shifted because the driving transistor DR is used for a long time, the current I$_{OLED}$ flowing to the first organic light emitting diode OLED1 may not be affected by a shift of the threshold voltage Vth of the driving transistor DR.

That is, according to the present disclosure described above, the first pixel 110a and the second pixel 110b may output light based on the data voltage Vdata without being affected by a shift of the threshold voltage Vth.

Figure 17:
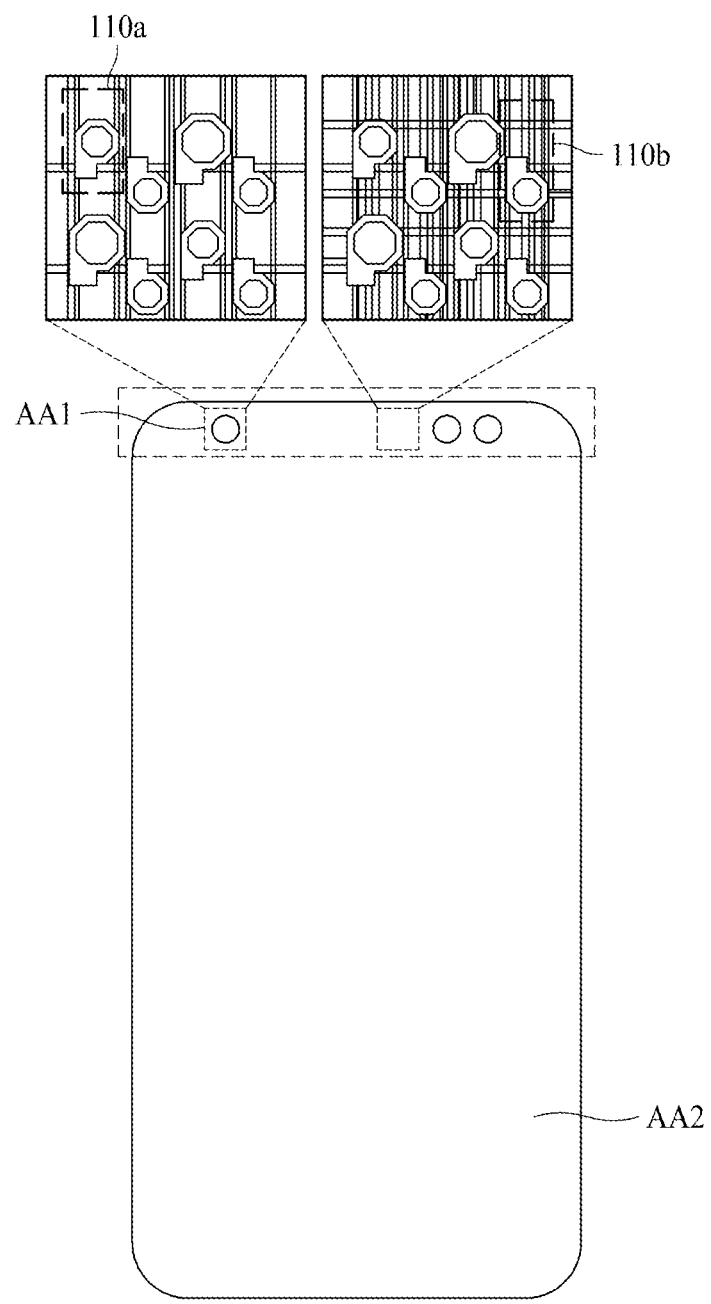
FIG. 17 is another exemplary diagram illustrating a first pixel and a second pixel each included in an organic light emitting display apparatus according to an embodiment of the present disclosure.
Figure 18:
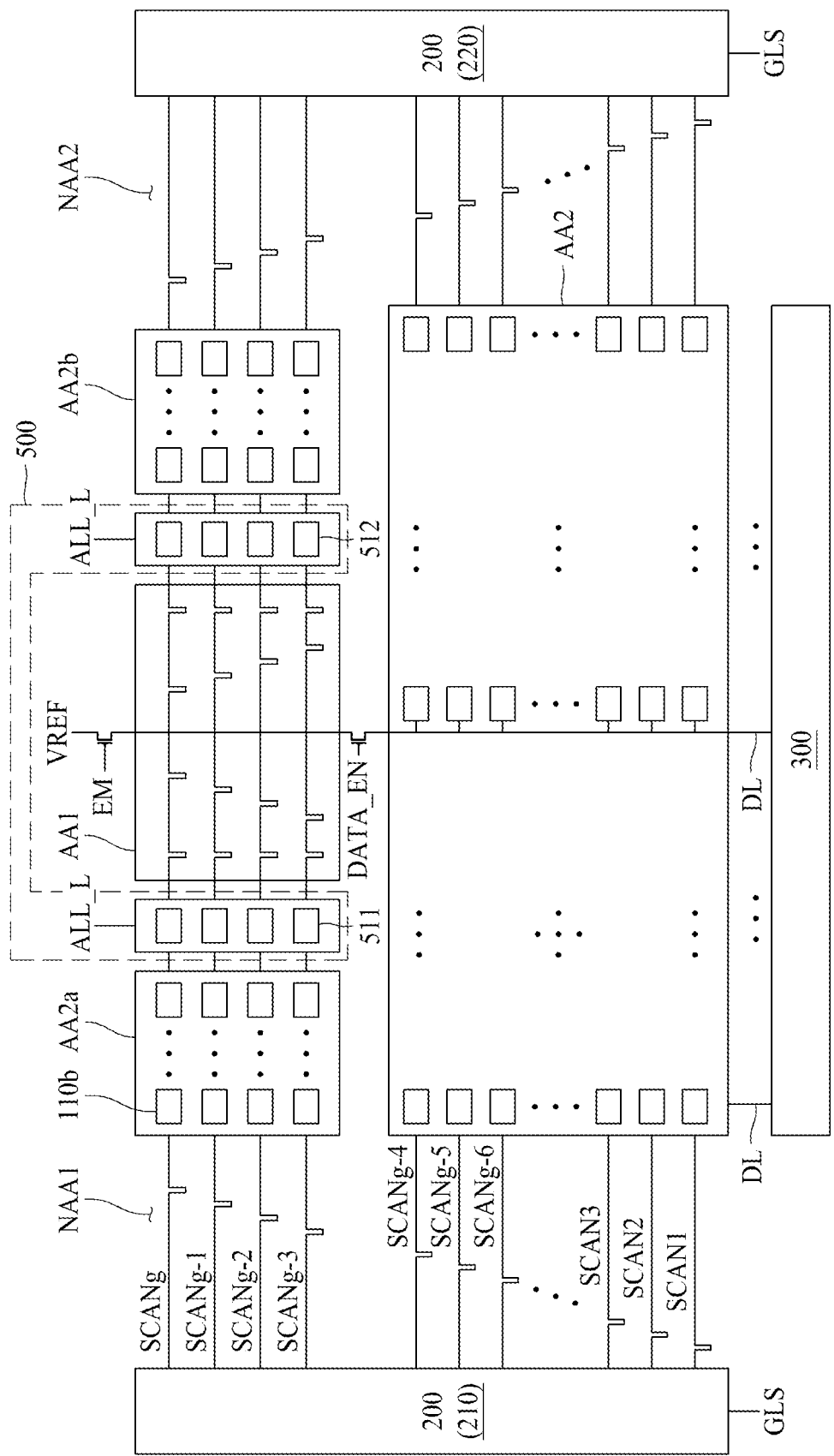
FIG. 18 is an exemplary diagram illustrating a gate driver, an initialization unit, and a transparent area each applied to the organic light emitting display apparatus illustrated in FIG. 17.

FIG. 17 is another exemplary diagram illustrating a first pixel and a second pixel each included in an organic light emitting display apparatus according to an embodiment of the present disclosure, and FIG. 18 is an exemplary diagram illustrating a gate driver, an initialization unit, and a transparent area each applied to the organic light emitting display apparatus illustrated in FIG. 17. In FIG. 18, gate pulses supplied to the first pixel 110a and the second pixel 110b are illustrated. In the following description, descriptions which are the same as or similar to descriptions given above with reference to FIGS. 1 to 16 are omitted or will be briefly given.

As described above, the organic light emitting display apparatus according to an embodiment of the present disclosure may include the organic light emitting display panel 100 including the first pixels 110a and the second pixels 110b, the gate driver 200, the data driver 300, the initialization unit 500, and the controller 400.

The transparent area AA1, as illustrated in FIGS. 2 and 5, may be formed from one end of the display area AA to the other end of the display area AA.

In this case, the initialization unit 500 may be provided in the first non-display area NAA1 along with the gate driver 200, or may be included in the gate driver 200. When the initialization unit 500 is separated from the gate driver 200, the initialization unit 500 may be provided between the gate driver 200 and the transparent area AA1.

Moreover, as illustrated in FIGS. 1, 17, and 18, the transparent area AA1 may be surrounded by the opaque area AA2. That is, the transparent area AA1 may be formed in only a region, corresponding to a region where the camera 600 is disposed in the organic light emitting display apparatus, of the organic light emitting display panel 100.

In this case, as illustrated in FIG. 18, the initialization unit 500 may be provided in a boundary region between the transparent area AA1 and a first opaque area AA2a provided at one side of the transparent area AA1. The initialization unit 500 may include a plurality of first initialization drivers 511 connected to the transparent area gate lines. The boundary region may be the first opaque area AA2a, or may be the transparent area AA1. For example, the initialization unit 500 may be provided in the second pixels 110b provided in the first opaque area AA2a, provided in the first pixels 110a provided in the transparent area AA1, or provided in the first pixels 110a and the second pixels 110b.

A configuration and a function of the initialization unit 500 may be the same as those of the initialization unit 500 described above with reference to FIGS. 9 to 12.

Therefore, a configuration and a function of the first initialization driver 511 illustrated in FIG. 18 may be the same as those of the first initialization driver 510 described above with reference to FIGS. 9 and 11.

That is, as illustrated in FIG. 11, each of the first initialization drivers 511 illustrated in FIG. 18 may include a first initialization transistor Tini1, which includes a first terminal connected to an initialization control signal supply line ISL, a second terminal connected to the transparent area gate line TGL, and a gate connected to a first turn-on control line TCL1, and a second initialization transistor Tini2 which includes a first terminal connected to an opaque area gate line GL extending from the gate driver 200 to the first opaque area AA2a among the gate lines, a second terminal connected to the transparent area gate line, and a gate connected to a second turn-on control line TCL2.

In this case, a difference between the first initialization driver 511 illustrated in FIG. 18 and the first initialization driver 510 described above with reference to FIGS. 9 and 11 may be that the first terminal of the second initialization transistor Tini2 is connected to the opaque area gate line GL extending from the gate driver 200 to the first opaque area AA2a among the gate lines.

That is, the initialization unit 500 described above with reference to FIGS. 9 and 11 may be directly connected to the gate driver 200, but the initialization unit 500 described above with reference to FIG. 18 may be connected to the gate driver 200 through the first opaque area AA2a.

Therefore, the first terminal of the second initialization transistor Tini2 illustrated in FIG. 18 may be connected to the gate driver 200 through the opaque area gate line GL extending from the gate driver 200 to the first opaque area AA2a among the gate lines.

Except for a structural difference described above, a configuration and a function of the first initialization driver 511 illustrated in FIG. 18 may be the same as those of the first initialization driver 510 illustrated in FIGS. 9 and 11.

In this case, each of the first initialization drivers 511 illustrated in FIG. 18 may transfer gate pulses SCANg-3 to SCANg, which are output from the gate driver 200 and pass through the first opaque area AA2A, to transparent area gate lines TGL provided in the transparent area AA1 among the plurality of gate lines, or may transfer, to the transparent area gate lines TGL, initialization control signals VGL for initializing the first pixel driving circuits provided in the transparent area AA1.

In this case, as illustrated in FIG. 18, the initialization unit 500 may further include a plurality of second initialization drivers 512.

For example, the second initialization drivers 512 may be provided in a boundary region between the transparent area AA1 and a second opaque area AA2b provided at the other side of the transparent area AA1. Also, the second initialization drivers 512 may be connected to the transparent area gate lines and a plurality of opaque area gate lines provided in the second opaque area AA2b.

That is, the second initialization drivers 512 may be provided to be symmetrical with the first initialization drivers 511 with the transparent areas AA1 therebetween.

Therefore, a configuration, a function, and a driving method of each of the second initialization drivers 512 may be the same as those of each of the first initialization drivers 511.

In the organic light emitting display apparatus, as illustrated in FIG. 18, the gate driver 200 may include a first driver 210, provided at the one side (i.e., the first non-display area NAA1) of the transparent area AA1 in the non-display area NAA, and a second driver 220 provided at the other side (i.e., the second non-display area NAA2) of the transparent area AA1 in the non-display area NAA.

The first driver 210 and the second driver 220 may simultaneously output gate pulses to the same gate lines, or may output the gate pulses to different gate lines.

In this case, the initialization unit 500 (particularly, the first initialization driver 510 included in the initialization unit 500) may supply a gate pulse, supplied through the first opaque area AA2a from the first driver 210, to the transparent area gate line TGL.

The second driver 220 may supply a gate pulse to the second opaque area AA2b provided at the other side NAA2 of the transparent area AA1. The second initialization drivers 512 may supply gate pulses, transferred through the second opaque area AA2b from the second driver 220, to the transparent area gate lines TGL provided in the transparent area AA1.

However, the second initialization drivers 512 may be omitted. In this case, gate pulses supplied from the second driver 220 may be supplied to only opaque area gate lines provided in the second opaque area AA2b. That is, the opaque area gate lines provided in the second opaque area AA2b may not be connected to the transparent area gate lines.

Figure 19A:
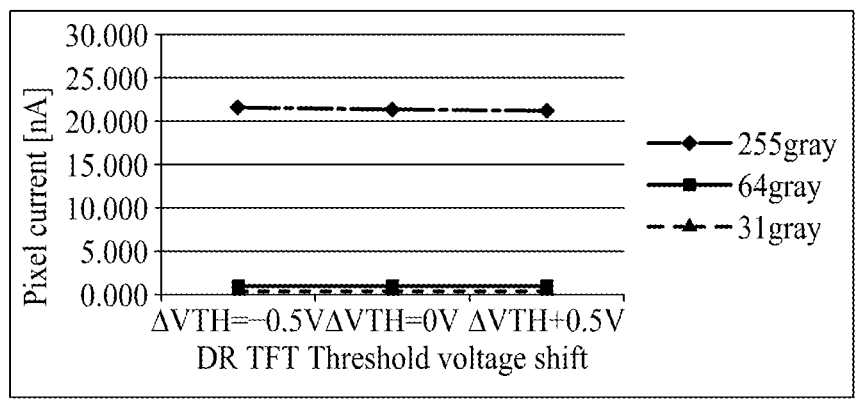
FIGS. 19A and 19B are exemplary diagrams illustrating a result obtained by comparing the compensation performance of a related art pixel driving circuit with the compensation performance of a first pixel driving circuit applied to an organic light emitting display apparatus according to an embodiment of the present disclosure.
Figure 19B:
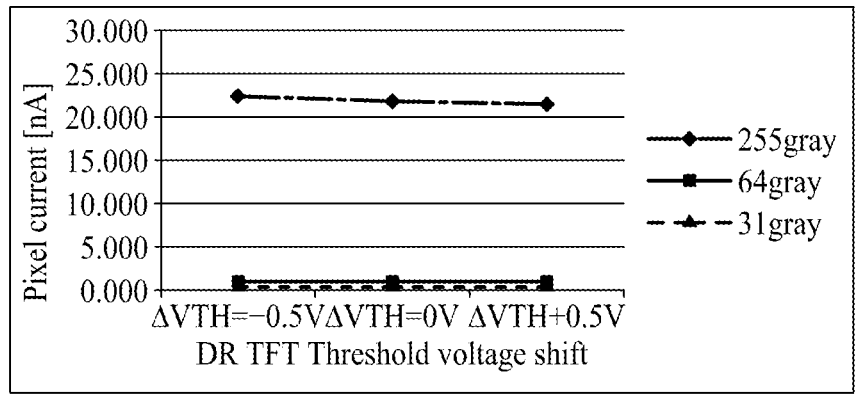

FIGS. 19A and 19B are exemplary diagrams illustrating a result obtained by comparing the compensation performance of a related art pixel driving circuit with the compensation performance of a first pixel driving circuit applied to an organic light emitting display apparatus according to an embodiment of the present disclosure. Particularly, FIG. 19A illustrates internal compensation performance based on the first pixel driving circuit PDC1 having a structure illustrated in FIG. 6, and FIG. 19B illustrates internal compensation performance based on the second pixel driving circuit PDC2 including seven transistors and one capacitor.

In the present disclosure, as described above, the first pixel 110a provided in the transparent area AA1 may include, for example, an internal compensation circuit (i.e., the first pixel driving circuit PDC1) including three transistors and one capacitor, and the second pixel 110b provided in the opaque area AA2 may include, for example, at least four capacitors.

In this case, particularly, FIGS. 19A and 19B illustrate a result obtained by comparing the compensation performance of the second pixel 110b, which includes seven transistors and one capacitor and performs internal compensation, with the compensation performance of the first pixel 110a which includes three transistors and one capacitor and performs internal compensation.

That is, in a low gray level such as 31 gray and 64 gray, compensation performance based on the first pixel driving circuit PDC1 maintains the same level as compensation performance based on the second pixel driving circuit PDC2, but in 255 gray, compensation performance based on the first pixel driving circuit PDC1 maintains a level which is higher than compensation performance based on the second pixel driving circuit PDC2.

Therefore, it may be seen that the compensation performance of the first pixel driving circuit PDC1 is similar to that of the second pixel driving circuit PDC2, and thus, there is no an image quality difference between the transparent area and the opaque area.

Features of the present disclosure described above will be briefly described.

In the present disclosure, for example, an internal compensation circuit (i.e., the first pixel driving circuit PDC1) including three PMOS transistors and one capacitor may be included in each of the first pixels 110a provided in the transparent area AA1, and an internal compensation circuit (i.e., the second pixel driving circuit PDC2) including four or more transistors and one or more capacitors may be included in each of the second pixels 110b provided in the opaque area AA2.

Therefore, a light transmittance of the transparent area may be higher than that of the opaque area.

The transparent area AA1 may correspond to a position of a camera disposed at the rear surface of the organic light emitting display panel 100 to face a region in front of the organic light emitting display panel 100.

A density (PPI) of pixels provided in the transparent area AA1 may be set to be equal to a density (PPI) of pixels provided in the opaque area AA2. Therefore, comparing with a related art organic light emitting display apparatus where a PPI of the transparent area is set to be lower than a PPI of the opaque area, the degradation in image quality may be minimized in the present disclosure. Accordingly, even when a camera is disposed at the rear surface of the organic light emitting display panel, photographing may be performed.

For example, in order to place the camera 600 and other sensors, as illustrated in FIG. 5, all regions corresponding to about 3 mm of an upper end (about 64 lines with respect to 537 ppi) of the organic light emitting display panel 100 may be formed as the transparent area AA1.

Moreover, as illustrated in FIG. 17, only a region corresponding to the camera 600 among regions corresponding to about 3 mm of the upper end of the organic light emitting display panel 100 may be the transparent area AA1. That is, only a region (about 3×3 mm, 537 ppi reference resolution 64×64), corresponding to the camera 600, of the organic light emitting display panel 100 may be the transparent area AA1.

An anode of the first organic light emitting diode OLED1 provided in the transparent area AA1 may be formed of a transparent electrode and a reflective electrode, but may be formed of only transparent metal, for increasing a transmittance.

In addition to the anode, all lines provided in the transparent area AA1 may be formed of transparent metal, for maximizing a transmittance of the transparent area AA1.

In the present disclosure, all first pixel driving circuits PDC1 provided in the transparent area AA1 may be simultaneously initialized, a threshold voltage may be compensated for by line units, data voltages may be recorded in all first pixels, and all lines may simultaneously emit light.

In the present disclosure, gate pulses output from the gate driver 200 may not differ from the related art. Therefore, a structure of the gate driver 200 may use a gate driver applied to a related art organic light emitting display apparatus.

In order to enhance a transmittance, as illustrated in FIG. 12, the first pixels 110a provided in the transparent area AA1 may use transparent metal such as ITO instead of a metal line (for example, titanium/aluminum/titanium (Ti/Al/TO) of the related art, and particularly, a reflective electrode (Ag) of an anode may be omitted for enhancing a transmittance.

In the present disclosure, the first pixel driving circuit PDC1 having a PMOS 3T1C structure occupying a smaller area than the second pixel driving circuit PDC2 may be provided in the transparent area AA1, thereby minimizing the degradation in image quality of the camera 600 facing a region in front of the organic light emitting display panel 100. However, the first pixel driving circuit PDC1 is not limited to including three transistors and one capacitor. That is, the first pixel driving circuit PDC1 may be variously provided as a number which is less than the number of transistors included in a related art internal compensation circuit, and particularly, the number of transistors included in the first pixel driving circuit PDC1 may be variously set to be less than the number of transistors included in the second pixel driving circuit PDC2. Accordingly, according to the present disclosure, an organic light emitting display panel having a high-transmittance transparent area may be provided.

According to the present disclosure, even without a notch or a hole, a full display may be implemented for photographing a region in front of an organic light emitting display panel.

In the present disclosure, the PMOS 3T1C structure may use a global shutter driving manner, but such a structure is applied to only some lines corresponding to a camera region (i.e., the transparent area AA1). Therefore, according to the present disclosure, a non-emission time for which a data voltage is recorded may be short, and thus, a high luminance of 600 nit or more may be implemented.

In the present disclosure, one organic light emitting display panel may include a transparent area, including an internal compensation circuit having the PMOS 3T1C structure, and an opaque area where an internal compensation circuit including four or more transistors is provided.

In the present disclosure, the transparent area including the internal compensation circuit having the PMOS 3T1C structure may be provided at a whole upper end line of the organic light emitting display panel, or may be provided in only a region corresponding to a camera. In this case, signals for controlling an internal compensation circuit (i.e., the first pixel driving circuit PDC1) provided in the transparent area may be supplied to the first pixel driving circuit PDC1 by the initialization unit 500.

In the present disclosure, various lines provided in the transparent area may use transparent metal, but may use opaque metal which is being used currently and widely, for improving IR-drop.

In the present disclosure, the anode provided in the transparent area may be formed of only transparent metal such as ITO, for enhancing a transmittance, but in order to enhance emission efficiency although a transmittance is reduced, the anode may be formed of transparent metal (ITO) and opaque metal (Ag) or an alloy thereof.

In an organic light emitting display apparatus according to the embodiments of the present disclosure, a first pixel driving circuit provided in a transparent area, corresponding to a position of a camera, of a display area displaying an image may have a shape differing from that of a second pixel driving circuit provided in an opaque area, except the transparent area, of the display area, and particularly, the number of transistors included in the first pixel driving circuit may be less than the number of transistors included in the second pixel driving circuit.

Therefore, the amount of light transferred to the camera through the transparent area may increase, and thus, the quality of an image captured by the camera may be enhanced.

That is, according to the embodiments of the present disclosure, a transparent pixel structure (a PMOS 3T1C internal compensation circuit) may be applied to a region, where a front camera is disposed, of the organic light emitting display panel, and thus, even when a camera is disposed on a rear surface of the organic light emitting display panel, photographing may be performed. Particularly, according to the embodiments of the present disclosure, pixels of the transparent area may be implemented at the same density (PPI) as pixels of a related art organic light emitting display panel, and thus, the reduction in image quality may decrease compared to the related art organic light emitting display panel where the pixels of the transparent area are implemented at a low density (PPI).

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display apparatus, comprising:
   an organic light emitting display panel including a display area having a transparent area and an opaque area, and a non-display area; and
   a sensor provided in the transparent area of a rear surface of the organic light emitting display panel,
   wherein the transparent area includes a first pixel driving circuit and a first organic light emitting diode connected to the first pixel driving circuit,
   wherein the opaque area includes a second pixel driving circuit and a second organic light emitting diode connected to the second pixel driving circuit,
   wherein the first pixel driving circuit comprises three transistors,
   wherein the second pixel driving circuit comprises at least four transistors.

2. The organic light emitting display apparatus of claim 1, further comprising:
   a gate driver configured to sequentially supply a gate pulse to a plurality of gate lines included in the organic light emitting display panel; and
   an initialization circuit configured to transfer gate pulses or initialization control signals, output from the gate driver, to a plurality of transparent area gate lines,
   wherein the initialization circuit comprises a plurality of first initialization drivers connected to the plurality of transparent area gate lines.

3. The organic light emitting display apparatus of claim 1, wherein
   each of the plurality of first initialization drivers comprises:
   a first initialization transistor including a first terminal connected to an initialization control signal supply line, a second terminal connected to a transparent area gate line, and a gate connected to a first turn-on control line; and
   a second initialization transistor including a first terminal connected to a transparent area gate output line of the gate driver, a second terminal connected to the transparent area gate line, and a gate connected to a second turn-on control line.

4. The organic light emitting display apparatus of claim 3, wherein a phase of a first turn-on control signal supplied through the first turn-on control line is opposite to a phase of a second turn-on control signal supplied through the second turn-on control line.

5. The organic light emitting display apparatus of claim 1, wherein the first pixel driving circuit comprises:
   a capacitor including a first terminal connected to a transfer line through which a reference voltage or a data voltage is transferred;
   a driving transistor including a first terminal connected to a first driving voltage line and a gate connected to a second terminal of the capacitor;
   a first transistor including a first terminal connected to the gate of the driving transistor, a second terminal connected to a second terminal of the driving transistor, and a gate connected to a transparent area gate line; and
   a second transistor including a first terminal connected to the second terminal of the driving transistor, a second terminal connected to the first organic light emitting diode, and a gate connected to an emission control line.

6. The organic light emitting display apparatus of claim 1, further comprising:
   a gate driver configured to sequentially supply a gate pulse to a plurality of gate lines included in the organic light emitting display panel; and
   an initialization circuit configured to transfer gate pulses or initialization control signals, output from the gate driver, to a plurality of transparent area gate lines,
   wherein the transparent area is laterally surrounded by the opaque area,
   the initialization circuit comprises a plurality of first initialization drivers, and
   each of the plurality of first initialization drivers is provided in a boundary region between the transparent area and a first opaque area provided at a first side of the transparent area and is connected to the plurality of transparent area gate lines.

7. The organic light emitting display apparatus of claim 6, wherein each of the plurality of first initialization drivers comprises:
   a first initialization transistor including a first terminal connected to an initialization control signal supply line, a second terminal connected to a transparent area gate line, and a gate connected to a first turn-on control line; and
   a second initialization transistor including a first terminal connected to an opaque area gate line extending from the gate driver to the first opaque area among the plurality of gate lines, a second terminal connected to the transparent area gate line, and a gate connected to a second turn-on control line.

8. The organic light emitting display apparatus of claim 6, wherein the gate driver comprises:
a first driver provided at the first side of the transparent area in the non-display area;
a second driver provided at a second side of the transparent area in the non-display area;
the initialization unit supplies the plurality of transparent area gate lines with a gate pulse supplied through the first opaque area from the first driver; and
the second driver supplies a gate pulse to a second opaque area provided at the second side of the transparent area.

9. The organic light emitting display apparatus of claim 8, wherein the initialization circuit further comprises a plurality of second initialization drivers provided in a boundary region between the transparent area and the second opaque area and connected to the plurality of transparent area gate lines.

10. The organic light emitting display apparatus of claim 5, wherein
a first terminal of the capacitor is connected to a reference voltage control transistor and a data voltage control transistor,
a first terminal of the reference voltage control transistor is connected to a reference voltage supply line through which a reference voltage is supplied, a second terminal thereof is connected to the first terminal of the capacitor, and a gate thereof is connected to an emission line through which an emission signal is supplied, and
a first terminal of the data voltage control transistor is connected to the first terminal of the capacitor, a second terminal thereof is connected to a data driver, and a gate thereof is connected to a data control line through which a data control signal is supplied.

11. The organic light emitting display apparatus of claim 10, wherein
a data extension line provided between the second terminal of the reference voltage control transistor and the first terminal of the data voltage control transistor is connected to a plurality of transfer lines which are connected to a plurality of first pixels provided along the data extension line, and
a data line provided between the data voltage control transistor and the data driver is connected to a plurality of opaque area gate lines which are connected to a plurality of second pixels provided along the data line.

12. The organic light emitting display apparatus of claim 9, wherein the plurality of second initialization drivers supply the plurality of transparent area gate lines with gate pulses transferred from the second driver through a plurality of opaque area gate lines provided in the opaque area.

13. The organic light emitting display apparatus of claim 9, wherein each of the plurality of second initialization drivers comprises:
a first initialization transistor including a first terminal connected to an initialization control signal supply line, a second terminal connected to a transparent area gate line, and a gate connected to a first turn-on control line; and
a second initialization transistor including a first terminal connected to a transparent area gate output line of the gate driver, a second terminal connected to the transparent area gate line, and a gate connected to a second turn-on control line.

14. The organic light emitting display apparatus of claim 5, wherein
a first driving voltage transferred to the first pixel driving circuit through the first driving voltage line has a high level and a low level.

15. The organic light emitting display apparatus of claim 1, wherein
the first organic light emitting diode includes an anode, a light emitting layer, and a cathode, and
the anode of the first organic light emitting diode is transparent.

16. An organic light emitting display panel, comprising:
a display area having a transparent area and an opaque area; and
a non-display area outside the display area;
wherein the display area includes a plurality of metal lines,
wherein the transparent area includes a first pixel driving circuit and a first organic light emitting diode connected to the first pixel driving circuit,
wherein the opaque area includes a second pixel driving circuit and a second organic light emitting diode connected to the second pixel driving circuit,
wherein the first pixel driving circuit includes fewer transistors than the second pixel driving circuit.

17. The organic light emitting display panel of claim 16, wherein
the first organic light emitting diode includes an anode, a light emitting layer, and a cathode, and
the anode of the first organic light emitting diode is transparent.

18. The organic light emitting display panel of claim 16, wherein the first pixel driving circuit comprises:
a capacitor including a first terminal connected to a transfer line through which a reference voltage or a data voltage is transferred;
a driving transistor including a first terminal connected to a first driving voltage line and a gate connected to a second terminal of the capacitor;
a first transistor including a first terminal connected to the gate of the driving transistor, a second terminal connected to a second terminal of the driving transistor, and a gate connected to a transparent area gate line; and
a second transistor including a first terminal connected to the second terminal of the driving transistor, a second terminal connected to the first organic light emitting diode, and a gate connected to an emission control line.

19. The organic light emitting display panel of claim 18, wherein
a first terminal of the capacitor is connected to a reference voltage control transistor and a data voltage control transistor,
a first terminal of the reference voltage control transistor is connected to a reference voltage supply line through which a reference voltage is supplied, a second terminal thereof is connected to the first terminal of the capacitor, and a gate thereof is connected to an emission line through which an emission signal is supplied, and
a first terminal of the data voltage control transistor is connected to the first terminal of the capacitor, a second terminal, and a gate thereof is connected to a data control line through which a data control signal is supplied.

20. The organic light emitting display panel of claim 19, wherein a data extension line provided between the second terminal of the reference voltage control transistor and the first terminal of the data voltage control transistor is connected to a plurality of transfer lines which are connected to a plurality of first pixels provided along the data extension line, and a data line provided between the data voltage control transistor and a data driver is connected to a plurality of opaque area gate lines which are connected to a plurality of second pixels provided along the data line.

21. An organic light emitting display panel, comprising:
a display area including:
  a transparent area that includes a first pixel driving circuit and a first organic light emitting diode connected to the first pixel driving circuit, the first pixel driving circuit including:
    a capacitor;
    a driving transistor coupled to the capacitor;
    a first transistor coupled the driving transistor; and
    a second transistor coupled to the driving transistor and to the first organic light emitting diode; and
  an opaque area includes a second pixel driving circuit and a second organic light emitting diode connected to the second pixel driving circuit, the second pixel driving circuit being different from the first pixel driving circuit.

22. The organic light emitting display panel of claim 21, wherein:
the capacitor includes a first terminal connected to a transfer line through which a reference voltage or a data voltage is transferred;

the driving transistor includes a first terminal connected to a first driving voltage line and a gate connected to a second terminal of the capacitor;

the first transistor includes a first terminal connected to the gate of the driving transistor, a second terminal connected to a second terminal of the driving transistor, and a gate connected to a transparent area gate line; and the second transistor includes a first terminal connected to the second terminal of the driving transistor, a second terminal connected to the first organic light emitting diode, and a gate connected to an emission control line.

23. An organic light emitting display panel, comprising:
a display area having a transparent area and an opaque area; and
a non-display area outside the display area;
wherein the display area includes a plurality of metal lines,
wherein the transparent area includes a first pixel driving circuit and a first organic light emitting diode connected to the first pixel driving circuit,
wherein the opaque area includes a second pixel driving circuit and a second organic light emitting diode connected to the second pixel driving circuit,
wherein the first pixel driving circuit includes fewer transistors than the second pixel driving circuit; and
wherein the plurality of metal lines includes an anode and a cathode in the transparent area, the cathode is transparent metal and the anode is a double layer including a transparent metal for enhancing a transmittance.

* * * * *